United States Patent
La Rosa et al.

(10) Patent No.: US 9,076,878 B2
(45) Date of Patent: Jul. 7, 2015

(54) NON-VOLATILE MEMORY WITH VERTICAL SELECTION TRANSISTORS

(71) Applicant: STMicroelectronics (Rousset) SAS, Rousset (FR)

(72) Inventors: Francesco La Rosa, Rousset (FR); Stephan Niel, Greasque (FR); Arnaud Regnier, Les Taillades (FR); Yoann Goasduff, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 85 days.

(21) Appl. No.: 14/043,718

(22) Filed: Oct. 1, 2013

(65) Prior Publication Data

US 2014/0097481 A1 Apr. 10, 2014

(30) Foreign Application Priority Data

Oct. 10, 2012 (FR) ...................................... 12 59659

(51) Int. Cl.
| | |
|---|---|
| *H01L 21/336* | (2006.01) |
| *H01L 29/788* | (2006.01) |
| *H01L 29/66* | (2006.01) |
| *G11C 16/04* | (2006.01) |
| *H01L 27/115* | (2006.01) |
| *H01L 29/78* | (2006.01) |
| *H01L 29/417* | (2006.01) |

(52) U.S. Cl.
CPC ........ *H01L 29/788* (2013.01); *H01L 29/66825* (2013.01); *G11C 16/0433* (2013.01); *H01L 29/7827* (2013.01); *H01L 27/11524* (2013.01); *H01L 27/11556* (2013.01); *H01L 29/4175* (2013.01); *H01L 29/66666* (2013.01)

(58) Field of Classification Search
CPC ..................... H01L 29/42344; H01L 29/7889
USPC .................................. 257/320; 438/272, 282
See application file for complete search history.

(56) References Cited

U.S. PATENT DOCUMENTS

| | | | |
|---|---|---|---|
| 5,592,000 A | 1/1997 | Onishi et al. | |
| 6,849,895 B2 * | 2/2005 | Osabe et al. | 257/316 |
| 6,995,418 B2 * | 2/2006 | Spitzer | 257/302 |
| 7,101,757 B2 * | 9/2006 | Ding | 438/257 |
| 2002/0153546 A1 | 10/2002 | Verhaar | |

* cited by examiner

*Primary Examiner* — Chandra Chaudhari
(74) *Attorney, Agent, or Firm* — Seed IP Law Group PLLC

(57) ABSTRACT

The present disclosure relates to a method for manufacturing a non-volatile memory on a semiconductive substrate, comprising the steps of implanting in the depth of the substrate a first doped region forming a source region of selection transistors, forming in the substrate a buried gate comprising deep parts extending between an upper face of the substrate and the first doped region, implanting between two adjacent deep parts of the buried gate, a second doped region forming a common drain region of common selection transistors of a pair of memory cells, the selection transistors of the pair of memory cells thus having channel regions extending between the first doped region and the second doped region, along faces opposite the two buried gate adjacent deep parts, and implanting along opposite upper edges of the buried gate, third doped regions forming source regions of charge accumulation transistors.

22 Claims, 23 Drawing Sheets

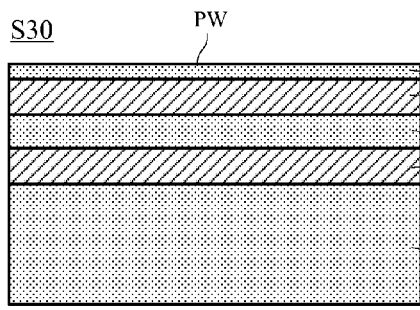
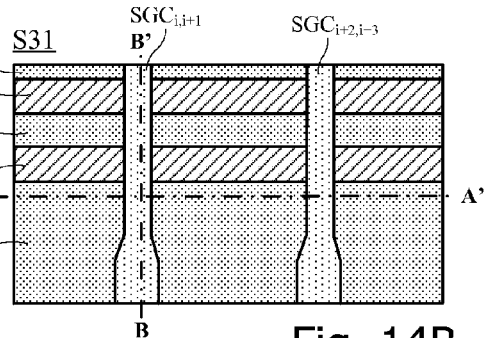
Fig. 14A  Fig. 14B
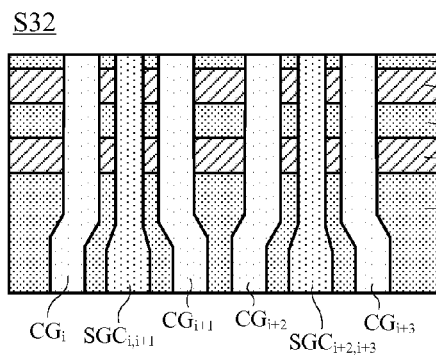
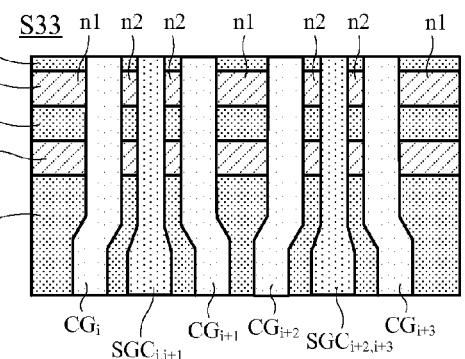
Fig. 14C  Fig. 14D
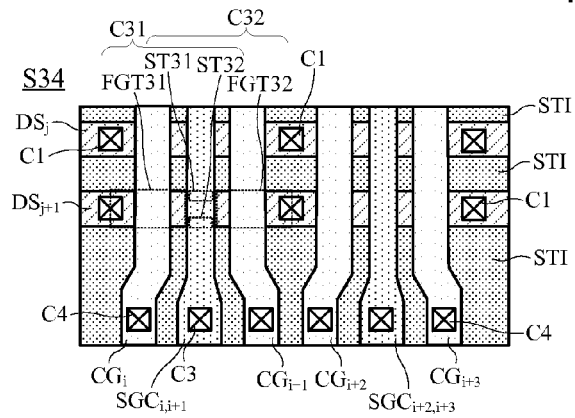
Fig. 15A
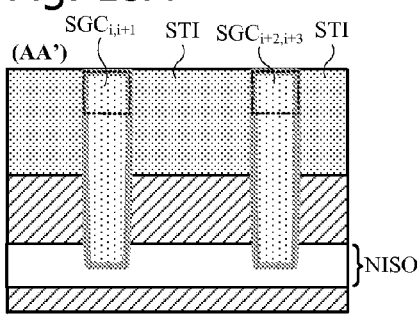
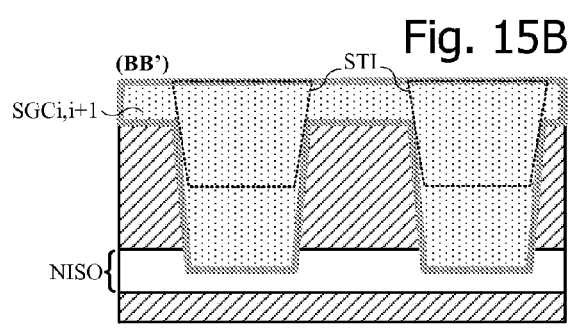
Fig. 15B

NON-VOLATILE MEMORY WITH VERTICAL SELECTION TRANSISTORS

BACKGROUND

1. Technical Field

The present disclosure relates to non-volatile memories in integrated circuits on semiconductor chips. The present disclosure relates more particularly to memories comprising UCP memory cells (Uniform Channel Program) that can be programmed and erased by the channel. The present disclosure relates more particularly to UCP memory cells with two transistors, comprising a selection transistor and a charge accumulation transistor such as a floating-gate transistor.

2. Description of the Related Art

FIG. 1 is a schematic cross-section of two UCP-type memory cells C11, C12, formed on a P-type substrate PW. Each memory cell C11, C12 comprises a floating-gate transistor FGT11, FGT12 and a selection transistor ST11, ST12. Each floating-gate transistor comprises a drain region n1 (D), a source region n2 (S), a floating gate FG, a control gate CG, and a channel region CH1 extending beneath the floating gate FG between the drain n1 and source n2 regions. Each selection transistor ST11, ST12 comprises a drain region n2 (D) common to the source region n2 of the corresponding floating-gate transistor FGT11, FGT12, a source region n3 (S), a gate SG, and a channel region CH2 extending beneath the gate SG between the drain n2 and source n3 regions. The two transistors ST11, ST12 share the same source region n3.

The regions n1, n2, n3 are generally formed by N-doping the substrate PW. The substrate is generally a P-type well formed in a semiconductor wafer WF. The well PW is isolated from the rest of the wafer WF by an N-doped isolation layer NISO surrounding the entire well. The gates FG, SG are generally made of level-1 polycrystalline silicon, or "poly1", and are formed on the substrate PW through layers of oxide D1, D2, the layer D1 being a tunnel oxide layer whereas the layer D2 is a gate oxide layer. The control gate CG is generally made of level-2 polycrystalline silicon, or "poly2", and is formed on the floating gate FG through an oxide layer D3.

The two memory cells are covered with a dielectric insulating material D0, which can also be oxide SiO2. The drain regions n1 of the transistors FGT11, FGT12 are linked to a same bit line BL through a contact C1 passing through the insulating material D0 to reach an intermediate conductor T1 formed in a first level of metal, or "metal1", and through a conductive via V1 passing through the insulating material D0 to link the conductor T1 to the bit line BL, formed in a second level of metal, or "metal2". The source region n3 common to the two transistors ST11, ST12 is linked to a source line SL through a contact C2 passing through the insulating material D0, the source line SL being for example formed in the first level of metal.

Table REF1 in Appendix 1 describes in relation with FIG. 2 the voltages applied to the memory cells C11, C12, FIG. 2 representing their equivalent wiring diagram. Table RD1 in Appendix 1 describes in relation with FIG. 3 values of voltages applied to the memory cells when reading the memory cell C11. The column "Ref." describes the reference allocated to each voltage value and the column "E.g." describes examples of voltage values. "GND" is the ground potential, i.e., the potential of the wafer WF, generally 0V.

Therefore, when reading the cell C11, the selection transistor ST12 receives the cutoff voltage Voff and is not on. A current (represented by arrows in FIG. 3) flows in the channel region CH1 of the transistor FGT11 and in the channel region CH2 of the transistor ST11. This current is representative of the threshold voltage of the transistor FGT11 which is itself representative of a programmed or erased state of the transistor, which depends on a quantity of electric charges stored in its floating gate. This current is sensed by a sense amplifier not represented in the figure, that supplies a binary datum stored by the cell C11.

The selection transistor ST12 being cut off by the voltage Voff, the value of the so-called "non-reading" voltage Vnrd applied to the floating-gate transistor FGT12 is not significant since this transistor is isolated from the source region n3 by the transistor ST12. In Table RD1, this voltage is chosen equal to the voltage VB1 of the substrate PW, here the potential GND.

The cells C11, C12 offer the advantage of being capable of being programmed or erased by applying a pair of determined voltages to the substrate PW and to the control gate CG of their transistor FGT11, FGT12, this programming and erasing mode being referred to as "channel programming and erasing." For a better understanding, Table ER1 in Appendix 1 describes values of voltages applied to the memory cells when erasing the cell C11. Table PG1 in Appendix 1 describes values of voltages applied to the memory cells when programming the cell C11. "HZ" designates a floating potential (open circuit).

The charge transfer from the substrate PW to the floating gate FG (programming) or from the floating gate to the substrate (erasing) is performed without going through the selection transistor ST11, as is the application of the high difference in potential (here 15V) enabling this charge transfer. As a result, the programming, erasing, and reading steps are conducted with low-value voltages, using the difference in potential between the substrate and the control gate of the floating-gate transistors. Therefore, the selection transistors ST11, ST12 do not undergo any high voltages, which allows for simple memory cells C11, C12 that are small in terms of semiconductor surface.

Despite the advantages such UCP memory cells offer, it may be desirable to provide a means of further reducing their size, so as to reduce the size of a memory array comprising a plurality of such memory cells. It may also be desirable to provide a compact memory structure.

BRIEF SUMMARY

Some embodiments relate to a method for manufacturing on a semiconductive substrate an integrated circuit with a non-volatile memory comprising memory cells each comprising a charge accumulation transistor and a selection transistor, the method comprising the steps of: implanting in the depth of the substrate a first doped region, forming a source region of common selection transistors of a pair of memory cells, forming a buried gate in the substrate, the buried gate comprising deep parts extending between an upper face of the substrate and the first doped region, implanting between two adjacent deep parts of the buried gate, a second doped region forming a common drain region of the selection transistors of the pair of memory cells, such that the selection transistors of the pair of memory cells have channel regions extending between the first doped region and the second doped region, along opposite faces of two adjacent deep parts of the buried gate, these faces extending in planes parallel to a channel direction of the floating-gate transistors, and implanting along opposite upper edges of the buried gate, third doped regions forming source regions of the charge accumulation transistors of the pair of memory cells, each third doped region being electrically coupled to the second doped region.

According to one embodiment, the step of implanting the first doped region comprises a step of implanting in the substrate a deep isolation layer surrounding a well in which the memory cells are formed.

According to one embodiment, the formation of the buried gate comprises a step of forming a conductive trench in the substrate, comprising steps of: forming in the substrate at least one trench having deep parts reaching the first doped region to form the deep parts of the buried gate, linked by superficial parts not reaching the doped isolation layer, implanting the second doped region at the bottom of the trench, depositing an insulating layer on inner edges of the trench, and filling the trench with a conductive material, the conductive trench being designed to form gates of selection transistors of memory cells, common to two rows of memory cells.

According to one embodiment, the method comprises a step of forming at least one isolation trench perpendicular to the buried gate, to electrically isolate memory cells of a same row from each other, the buried gate being formed after the isolation trench and sectioning the isolation trench.

According to one embodiment, the isolation trench reaches a deep doped isolation layer, at a depth greater than that of the deep parts of the buried gate.

According to one embodiment, the method comprises a step of forming on the surface of the substrate conductive lines parallel to the conductive trench, to form control gates for controlling charge accumulation transistors.

Some embodiments also relate to an integrated circuit comprising a non-volatile memory formed in a semiconductive substrate, the memory comprising at least one pair of memory cells each comprising a charge accumulation transistor in series with a selection transistor, a buried gate common to the selection transistors of the two memory cells, the buried gate comprising deep parts extending between an upper face of the substrate and a first deep doped region forming a common source region of the selection transistors of the two memory cells, a second doped region extending between two adjacent deep parts of the buried gate, and forming a common drain region of the selection transistors of the pair of memory cells, such that the selection transistors of the pair of memory cells have channel regions extending between the first doped region and the second doped region, along opposite faces of two adjacent deep parts of the buried gate, these faces extending in planes parallel to a channel direction of the floating-gate transistors, and third doped regions extending along upper edges of the buried gate, forming drain regions of the charge accumulation transistors of the pair of memory cells, each third doped region being electrically linked to the second doped region.

According to one embodiment, the first doped region forms an isolation layer delimiting a well in which the memory cells are formed, the isolation layer forming a source line of the selection transistors of the pair of memory cells.

According to one embodiment, the buried gate comprises superficial parts linking the deep parts, and thus forms a conductive trench.

According to one embodiment, the memory comprises at least one isolation trench perpendicular to the conductive trench, and an area in which the conductive trench intersects with the isolation trench delimiting two sections of isolation trench.

According to one embodiment, the isolation trench reaches a deep doped isolation layer, so as to form mini wells isolated from each other, in which several pairs of memory cells are formed.

According to one embodiment, the memory comprises at least two rows of memory cells each comprising groups of memory cells which can be individually erased, formed in different isolated wells.

According to one embodiment, the memory comprises at least two isolated wells in which a line of memory cells is respectively formed, each well being biased either by a common line, or by a voltage supplied to the memory cell line.

BRIEF DESCRIPTION OF THE SEVERAL VIEWS OF THE DRAWINGS

Some examples of embodiments of the present disclosure will be described below in relation with, but not limited to, the following figures, in which:

FIGS. 14A to 14E are top views showing other steps of a method for manufacturing memory cells according to the present disclosure, FIGS. 15A, 15B are cross-sections showing a step represented in FIG. 14B, according to one embodiment.

DETAILED DESCRIPTION

Figure 1:
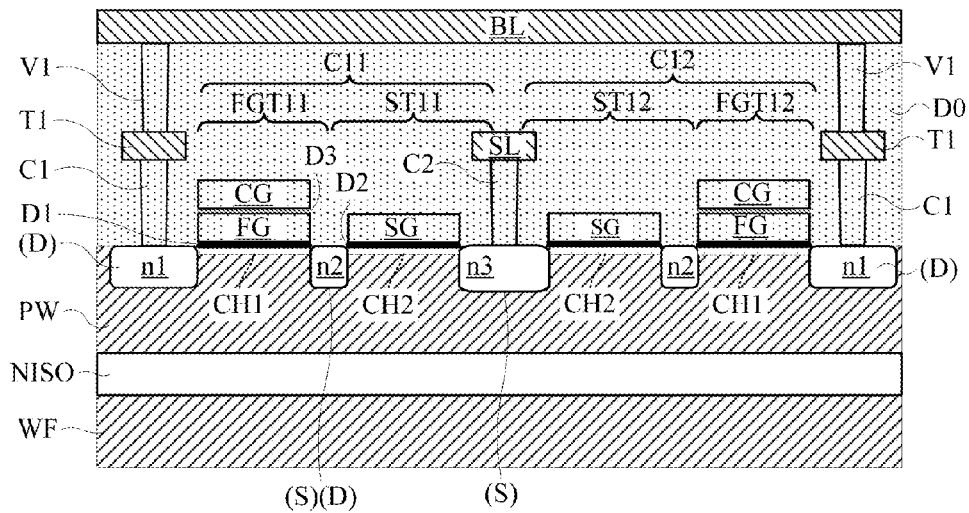
FIG. 1 described above is a schematic cross-section of a pair of classic memory cells, FIG. 2 described above is the wiring diagram of the memory cells, FIG. 3 described above shows a classic method for reading a memory cell of the pair of memory cells in FIG. 1.
Figure 2:
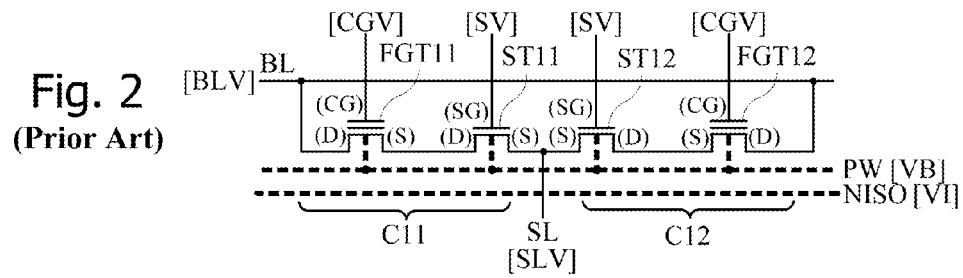
Figure 3:
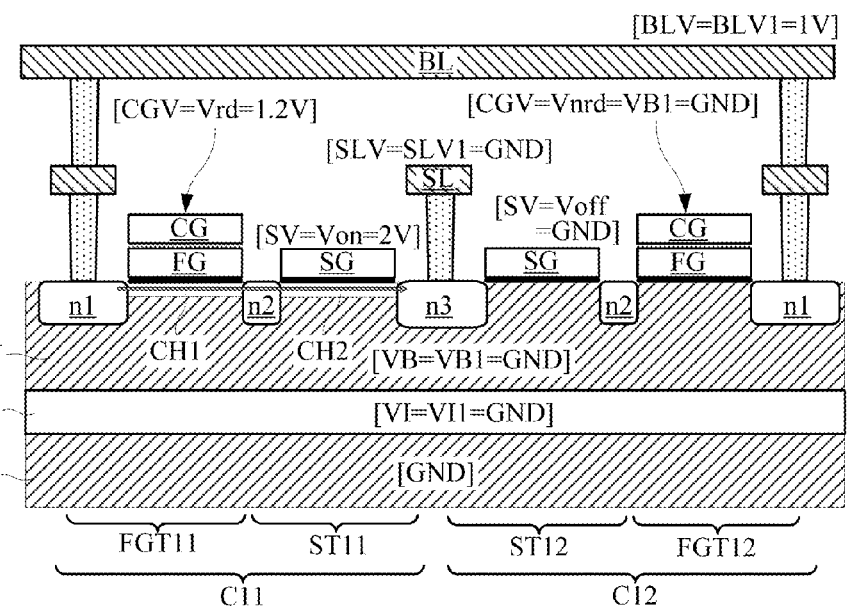
Figure 4:
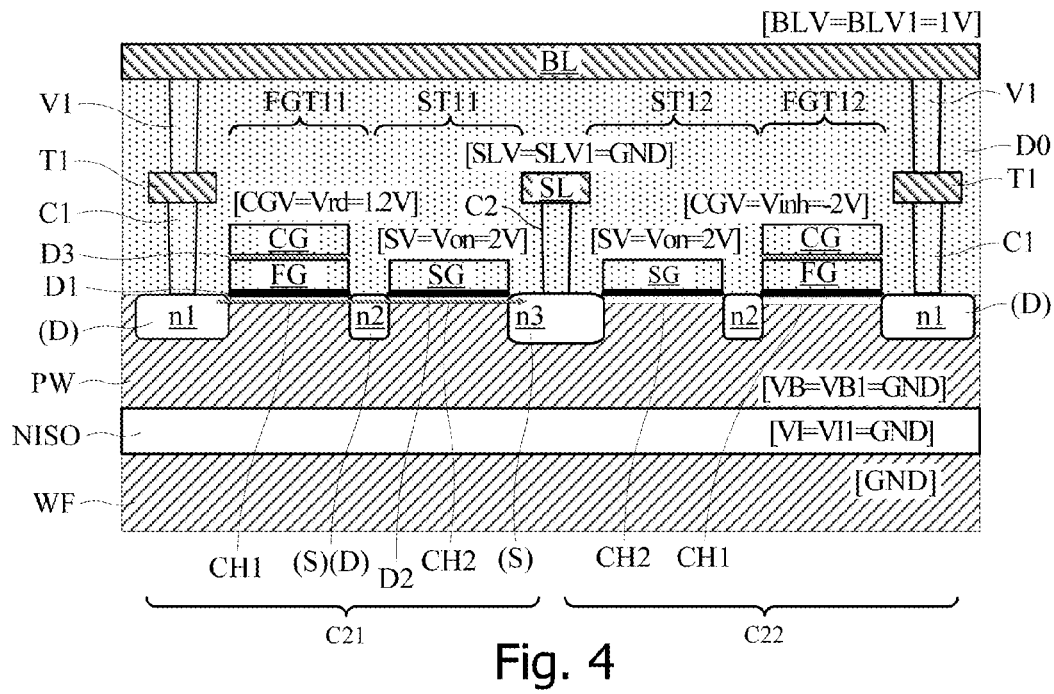
FIG. 4 shows a reading method according to the present disclosure for reading a memory cell of the classic pair of memory cells in FIG. 1.

Table RD2 in Appendix 1 describes in relation with FIG. 4 a reading method according to the present disclosure for reading one of the memory cells C11, C12 shown in FIG. 1. The voltages mentioned in the first column of the table have been described above in relation with Table REF1. The example described here relates to the reading of the memory cell C11. The cell C12 can be read in a similar manner by applying the voltages applied to the cell C11 to it, and vice-versa.

The reading method produces an effect similar to the one described by Table RD1: the cell C11 is on and is passed through by a current which also passes through the bit line BL. This current is sensed by a sense amplifier (not represented).

This method differs from the one described by Table RD1 in that the gates of the two selection transistors ST11 and ST12 receive the read-select voltage Von, the non-read-select voltage Voff no longer being used for the pair of memory cells considered. Therefore, the selection transistor ST12 of the cell C12 is put to the on state and has a conductive channel in its channel region CH2. In order to avoid the cell C12 being passed through by a current, the voltage CGV applied to the control gate of the transistor FGT12, instead of being equal to the non-read voltage Vnread, is equal to an inhibit voltage Vinh which forces the transistor FGT12 to the off state and thus prevents it from conducting. The inhibit voltage Vinh, here a negative voltage, is chosen lower than the lowest possible value of the threshold voltage of the transistor FGT12, which varies according to its programmed or erased state, so as to make sure that the transistor FGT12 remains in the off state. In other words, the selection transistor ST12, usually used to read-select a memory cell, is no longer used in its usual function, for the pair of memory cells considered, and the floating-gate transistor FGT12 is forced to the off state.

Therefore, a feature of this reading method is that the voltages applied to the gates of the selection transistors ST11, ST12 are identical whatever the memory cell read in the pair of memory cells. It will be noted that this feature of the reading method relates to two neighboring memory cells forming a pair, i.e., sharing the same source region and linked to the same bit line. Generally speaking, it relates to two rows of memory cells made up of neighboring memory cells connected to the same group of bit lines. This feature does not relate to other memory cells, the selection transistors of which are classically put to the off state when reading one of these memory cells.

This feature must be compared with two other features appearing in Tables ER1 and PG1, i.e., that the voltages applied to the gates of the selection transistors ST11, ST12 when erasing or programming a memory cell of the pair of memory cells, are themselves identical whatever the memory cell erased or programmed. By combining these features, it appears that the two selection transistors of a pair of memory cells may receive the same voltage whatever the process to be done (reading, erasing or programming), and whatever the memory cell undergoing this process. This combination of features enables structural modifications of the pairs of memory cells to be provided for, in order to reduce their size, as described below.

Figure 5:
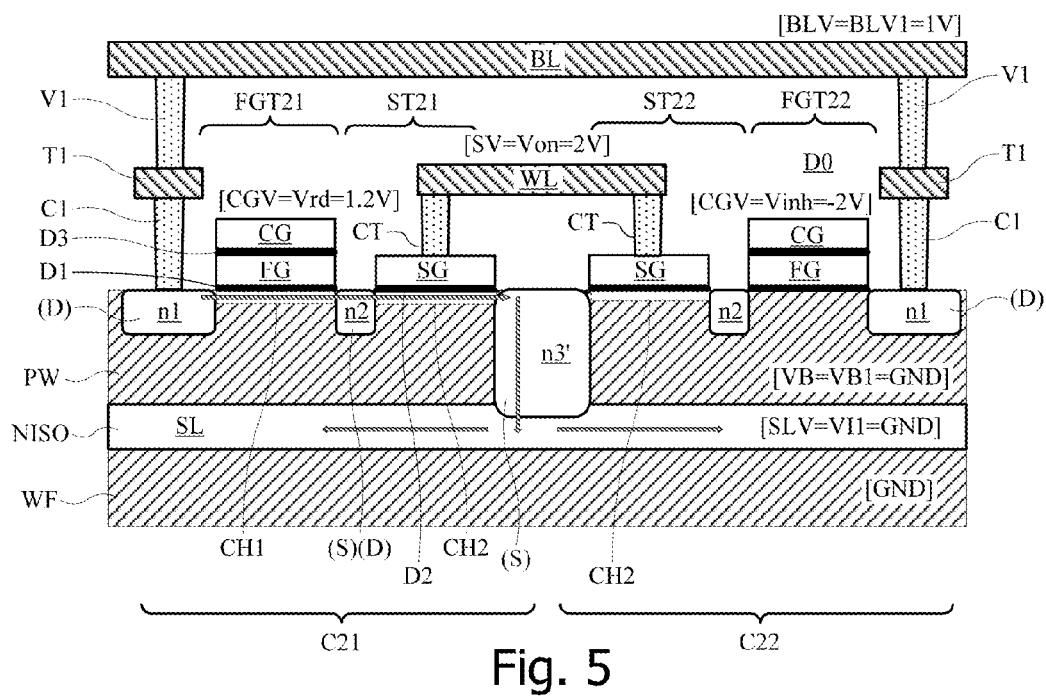
FIG. 5 is a schematic cross-section of a first embodiment of a pair of memory cells according to the present disclosure.

FIG. 5 represents a first embodiment of a pair of memory cells C21, C22 according to the present disclosure. Each memory cell C21, C22 comprises a floating-gate transistor FGT21, FGT22 and a selection transistor ST21, ST22. The structure of the memory cells C21, C22 is identical to that of the memory cells C11, C12 except for two features:

1) the gates SG of the selection transistors ST21, ST22 are connected to a common word line WL. The word line WL is for example formed in the first level of metal ("metal1") and is connected to the gates of the transistors by contacts CT passing through the dielectric layer D0 which covers the two memory cells.

2) The classic source line SL (Cf. FIG. 4) is removed. The source region n3 of the transistors ST11, ST12 shown in FIG. 4 is replaced with a source region n3' of the transistors ST21, ST22 that is deeper than the source region n3 and reaches the buried layer NISO delimiting the well PW in which the two memory cells are implanted. Therefore, the source region n3' and the layer NISO have the same electric potential, and the layer NISO is used as source line SL.

These two features are independent of each other and are shown on the same figure for greater convenience. The removal of the source line and its replacement with the layer NISO enables the structure of the upper metal levels to be simplified. Moreover, as the layer NISO has the shape of a wafer delimited by vertical walls, it has an electric resistance lower than a doped semiconductor layer that would be in the form of a strip.

The feasibility of using the layer NISO as source line can be shown by observing, in Tables RD2, ER1 and PG1, the electric voltages applied to the source line SL and to the layer NISO:

1) Table RD2 shows that the electric potential SLV of the source line is the same as the potential VI of the layer NISO when reading a memory cell, i.e., the ground potential GND. Therefore, the layer NISO can be used as source line when reading a memory cell.

2) Table ER1 shows that, when erasing a memory cell, the voltage SLV of the source line is taken to a floating potential SLV2=HZ while the voltage VI of the layer NISO is taken to a potential VI2=5V. However, the selection transistors are not on as the voltage SV applied to their gates (SV=SV2=5V) is identical to that of the substrate (VB=VB2=5V), such that no conductive channel forms in their channel region CH2. In these conditions, the source line SL can be taken to the potential of the layer NISO instead of being left floating, without disturbing the erasing process. Therefore, it is also possible to use the layer NISO as source line, without modifying its potential, during an erasing process, so that its isolation function, which uses this potential, is maintained.

3) Lastly, Table PG1 shows that, when programming a memory cell, the voltage SLV of the source line is taken to a floating potential SLV2=HZ while the voltage VI of the layer NISO is taken to a potential VI2=GND. As the selection transistors are not on either when programming the memory cell, the source line SL can be taken to the potential GND instead of being left floating, without disturbing the programming process. Therefore, it is also possible to use the layer NISO as source line, without modifying its potential, during the programming process.

Table REF2 in Appendix 1 describes the voltages applied to the memory cells C21, C22. Except for the references allocated to the different transistors, Table REF2 is identical to Table REF1. The voltage NISO no longer appears and is considered to form the voltage SLV of the source line.

Table RD3 in Appendix 1 describes in relation with FIG. 5 values of voltages applied to the memory cells when reading the memory cell C21. Except for the references allocated to the different transistors, the reading method is identical to the one described in Table RD2.

Figure 6:
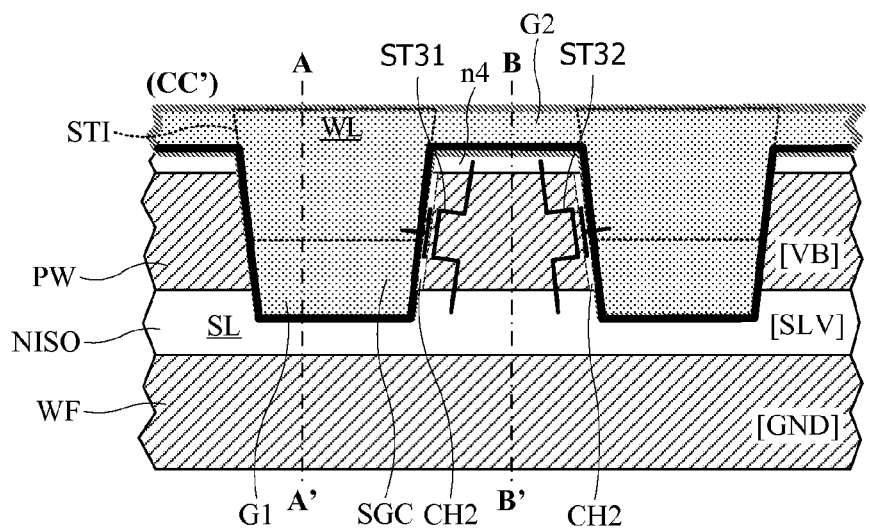
FIG. 6 is a transverse schematic cross-section of two selection transistors of a pair of memory cells, according to a second embodiment.
Figure 7A:
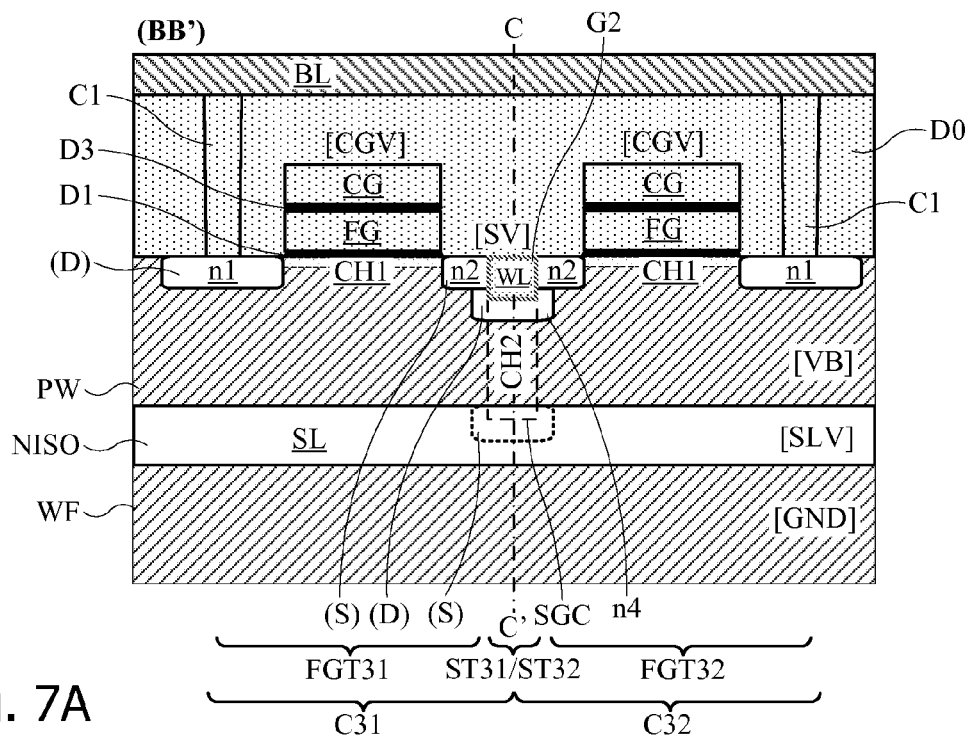
FIGS. 7A, 7B are cross-sections of the pair of memory cells in FIG. 6, along cutting lines AA' and BB'.
Figure 7B:
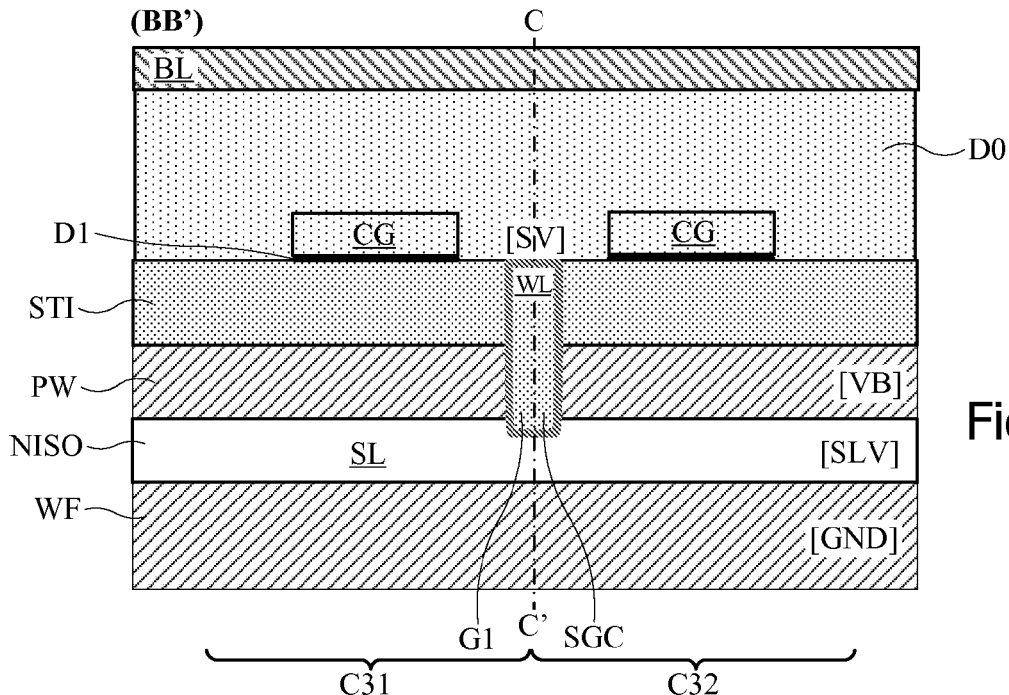

FIGS. 6, 7A and 7B represent a second embodiment of memory cells C31, C32 according to the present disclosure. FIGS. 7A and 7B are longitudinal cross-sections according to cutting planes AA', BB' represented in FIG. 6. FIG. 6 is a transverse cross-section according to a cutting plane CC' represented in FIGS. 7A, 7B. Each memory cell C31, C32 comprises a floating-gate transistor FGT31, FGT32 and two selection transistors ST31, ST32 common to the two memory cells C31, C32. The transistors FGT31, FGT32 are of the same structure as the transistors FGT21, FGT22 and each has a horizontal channel region CH1 extending beneath its floating gate FG, between the drain n1 and source n2 regions.

The selection transistors ST31, ST32 differ from the selection transistors ST21, ST22 in that they each have a vertical gate SGC. This vertical gate SGC is buried in the substrate PW through an insulating layer 12, for example made of silicon oxide ($SiO_2$), forming the gate oxide of the selection transistor ST31, ST32. It comprises deep parts G1 extending in the depth of the substrate PW and having lower edges which penetrate in the layer NISO, alternating with superficial parts G2 formed superficially in the substrate PW. The layer NISO thus forms, in its part surrounding the lower front and rear edges (compared to the planes in FIGS. 7A, 7B) of the gate SGC, the common source region (S) of the transistors ST31, ST32. The layer NISO also forms, as above, the source line SL of these transistors. The common drain region n4 (D) of the transistors ST31, ST32, which is in contact with the source regions n2 of the transistors FGT31, FGT32, extends beneath the parts G2 of the gate SGC.

Thus, the transistors ST31, ST32 (of a same pair of memory cells) have substantially vertical channel regions CH2 which extend beneath a gate part G2, along substantially vertical and opposite faces, of two adjacent gate parts G1, between the region n4 and the layer NISO. Each gate part G1 forms two gates of selection transistors respectively of two adjacent memory cells belonging to the same word line, but not to the same pair of memory cells. The result is that the channels CH2 of the selection transistors of the memory cell extend in planes parallel to a channel direction of the channels CH1 of the floating-gate transistors.

In relation to the structure of the pair of memory cells C21, C22, the structure of the pair of memory cells C31, C32 offers the advantage of occupying a very small semiconductor surface area, due to the removal of the selection transistors on the substrate surface, such transistors being changed into buried transistors.

As will be seen below in the light of examples of manufacturing methods, the vertical gate SGC is made from a conductive trench which links several pairs of memory cells, as shown in cross-section in FIGS. 7A, 7B. This trench has a variable depth to form the parts G1, G2 of the gate SGC. Depending on the manufacturing method chosen (presence or absence of the gate parts G2), this trench may have no any electrical discontinuity. It can then be used directly as word line WL, as indicated by the reference "WL" in FIGS. 6, 7A and 7B. In other embodiments, only the deep parts G1 are formed, the parts G2 then being removed. In this case, each vertical gate SGC of a pair of selection transistors is independent of others and must be connected individually to a word line formed in a level of metal. The electrical continuity of the word line is then ensured by a level of metal, by forming contacts on the parts G2 and by linking the contacts to the level of metal by conductive vias to pass through one or more isolation layers between the contacts and the level of metal.

It shall be noted that it is not necessary for the vertical gates SGC of the selection transistors (parts G1) to extend up to the doped isolation layer (NISO). Indeed, the electrical continuity between a source region at the lower end of the parts G1 of the gates SGC can be made by a doped region electrically linked to the layer NISO.

Figure 8:
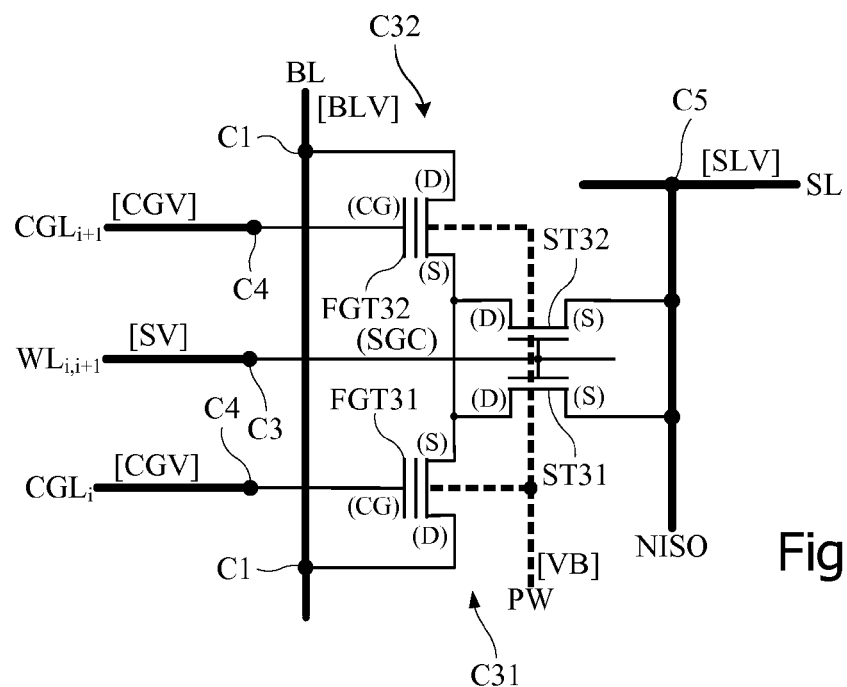
FIG. 8 is the wiring diagram of the pair of memory cells in FIG. 7A, FIGS. 9 to 11 are schematic cross-sections of a pair of memory cells according to the second embodiment, respectively showing methods for reading, erasing and programming a memory cell of the pair of memory cells, according to one embodiment.

FIG. 8 is the wiring diagram of the memory cells C31, C32. The control gate of the transistor FGT31 is connected to a control gate line $CGL_i$ through a contact C4. The control gate of the transistor FGT32 is connected to a control gate line $CGL_{i+1}$ through a contact C4. The drain regions (D) of the transistors FGT31, FGT32 are connected to a bit line BL through contacts C1. The source regions (S) of the transistors FGT31, FGT32 are connected to the drain region (D) common to the transistors ST31, ST32. The vertical gate SGC of the transistors ST31, ST32 is connected to a word line $WL_{i,i+1}$ common to the two memory cells through a contact C3. Alternatively, it can itself form the word line $WL_{i,i+1}$, as indicated above. The channel regions of the transistors FGT31, FGT32, ST31, ST32 are at the electric potential of the well PW, as represented by dotted lines. Lastly, the common source region (S) of the transistors ST31, ST32 is electrically linked to the layer NISO forming the source line. The latter can be connected through a contact C5 to a main source line SL formed in a level of metal.

FIGS. 9 to 12 represent a pair of memory cells, as represented in FIGS. 7A, 7B. Table REF3 in Appendix 1 describes in relation with FIGS. 7A, 7B, the voltages applied to the memory cells C31, C32. Except for the references allocated to the different transistors, Table REF3 is identical to Table REF2. The voltage SLV is now a unique voltage applied to the gate SGC of the transistors ST31, ST32.

Figure 9:
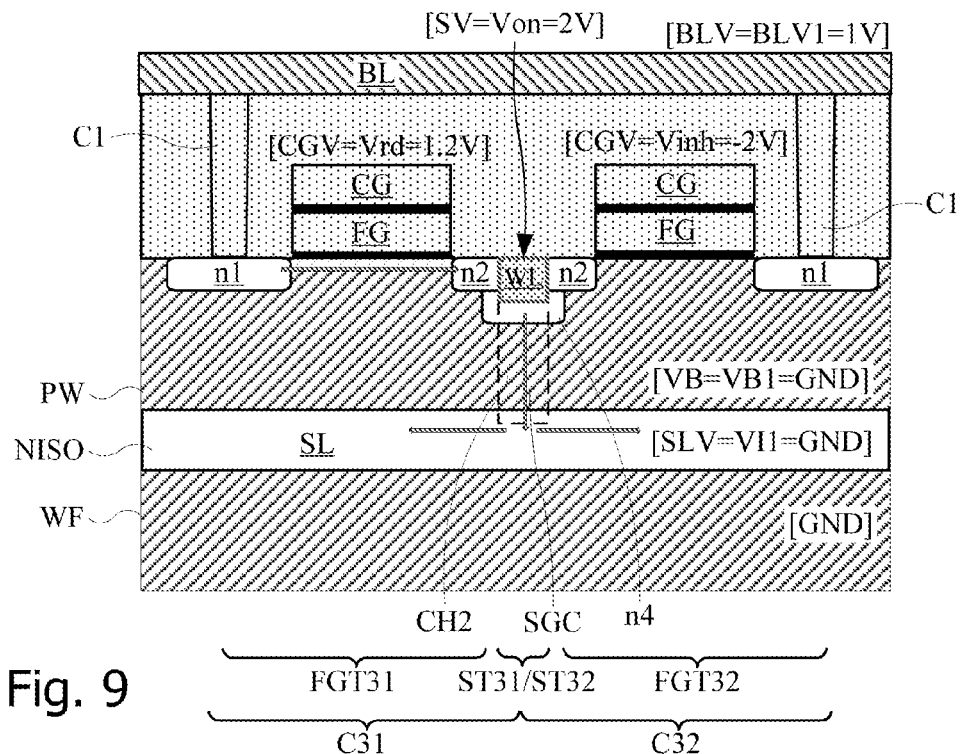

Table RD4 in Appendix 1 describes in relation with FIG. 9 values of voltages applied to the memory cells when reading the memory cell C31. Table RD4 is identical to Table RD3, except for the references of the memory cells and transistors. Therefore, in reading mode, the memory cells C31, C32 are equivalent to the memory cells C21, C22. In FIG. 9, arrows show that a current passes through the channel region CH1 of the transistor FGT31 and the vertical channel region CH2 of the transistors ST31, ST32, under the effect of the voltage SV=Von applied to the common gate SGC, but the associated floating-gate transistor FGT32 (belonging to the same pair of memory cells) remains off under the effect of the inhibit voltage Vinh.

Figure 10:
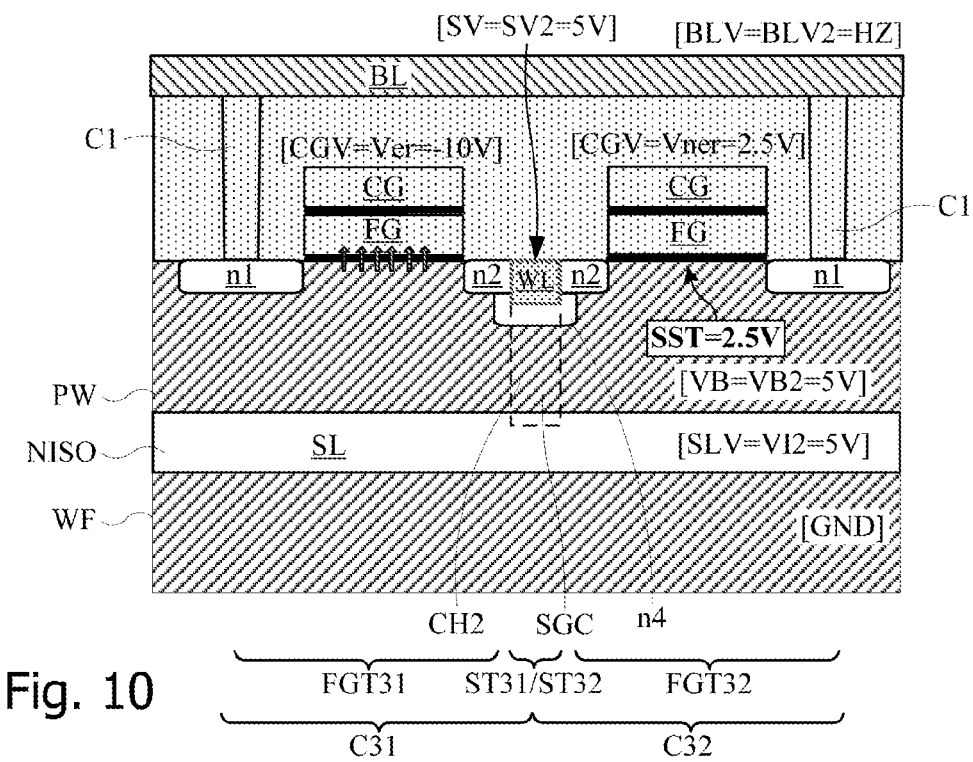

Table ER2 in Appendix 1 describes in relation with FIG. 10 values of voltages applied to the memory cells when erasing the memory cell C31. The erasing method described in Table ER2 differs from the one described in Table ER1 in that the voltage SLV of the source line, formed by the layer NISO, is equal to the voltage V12 that is applied to the layer NISO in the method described in Table ER1. In FIG. 10, arrows show that an electric field appears between the substrate PW and the floating gate FG of the transistor FGT31. This electric field extracts electrons from the floating gate by tunnel effect (Fowler Nordheim effect). Furthermore, the transistor FGT32 undergoes a so-called "Soft Stress" effect SST due to the difference in potential between the substrate PW and its control gate, here equal to 2.5V. This soft stress effect is not sufficient to notably extract electric charges from the floating gate of this transistor.

Figure 11:
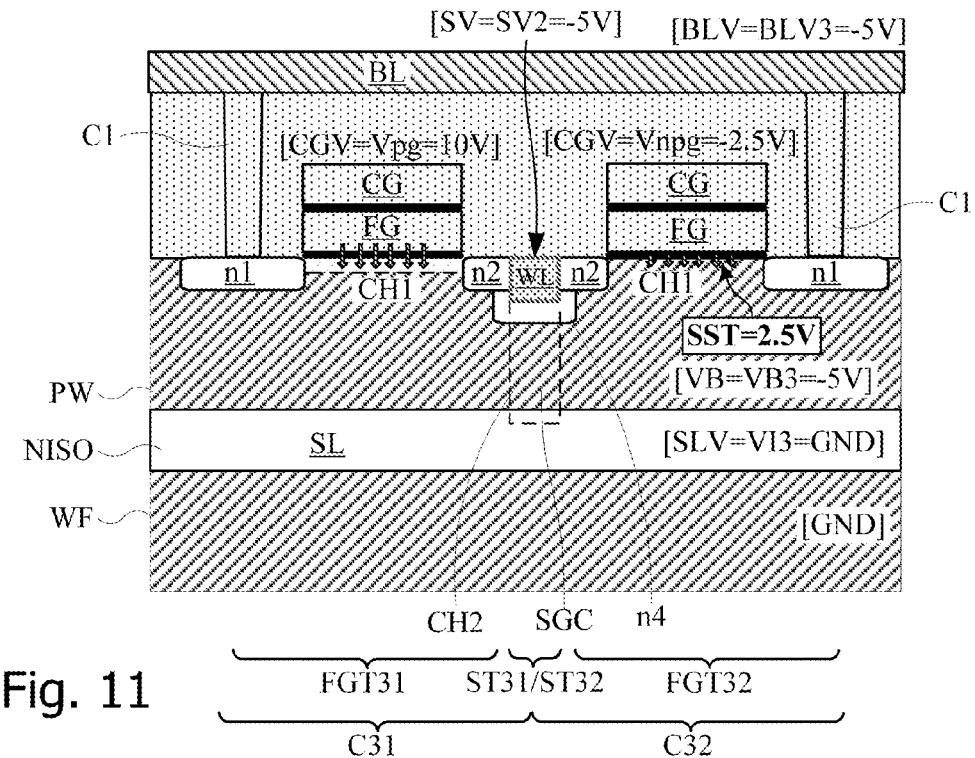

Table PG2 in Appendix 1 describes in relation with FIG. 11 values of voltages applied to the memory cells when programming the memory cell C31. The programming method described in Table PG2 differs from the one described in Table PG1 in that the voltage SLV of the source line, formed by the layer NISO, is equal to the voltage VI3 that is applied to the layer NISO in the method described in Table PG1. In FIG. 11, arrows show that an electric field appears between the substrate PW and the floating gate FG of the transistor FGT31. This electric field generates a conductive channel in the channel region CH1 of the transistor FGT31, and causes the injection of electrons into the floating gate by tunnel effect (Fowler Nordheim effect). Furthermore, the transistor FGT32 undergoes a soft stress effect SST due to the difference in potential between the substrate PW and its control gate, here equal to −2.5V. This soft stress effect is not sufficient to inject electric charges into the floating gate of this transistor.

Figure 12:
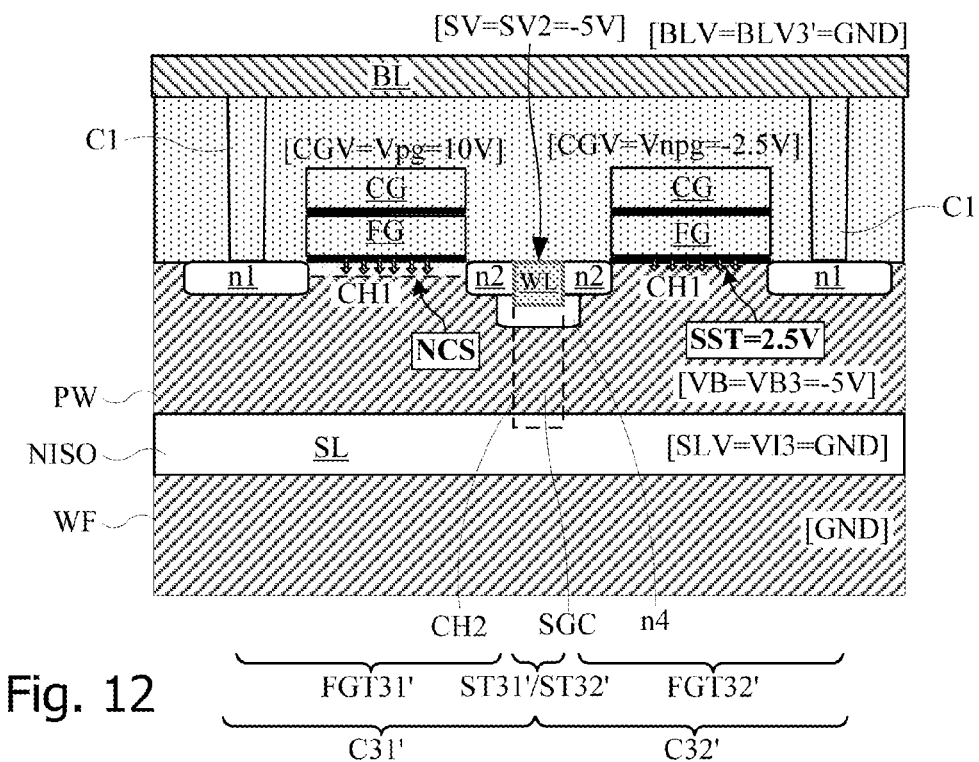
FIG. 12 is a schematic cross-section of a pair of memory cells according to the second embodiment, showing voltages undergone by neighboring memory cells during the programming step in FIG. 11, FIGS. 13A to 13L represent longitudinal and transverse cross-sections, showing steps of a method for manufacturing memory cells according to the present disclosure.

Table PG2' in Appendix 1 describes in relation with FIG. 12 values of voltages undergone by neighboring memory cells C31', C32' during the step of programming the memory cell C31 shown in FIG. 11. These neighboring memory cells C31', C32' are linked to the same word line and to the same control gate lines as the memory cells C31, C32, but are linked to a different bit line BL'. In relation to the cutting plane in FIG. 12, these memory cells C31', C32' are "in front of" or "behind" the memory cells C31, C32 in FIG. 11. These memory cells receive the same voltages as the memory cells C31, C32, except for the bit line voltage BLV that is taken to a non-programming voltage BLV3', for example the ground potential GND.

The transistor FGT32' undergoes a soft stress effect SST due to the difference in potential between the substrate PW and its control gate, here equal to −2.5V. This soft stress effect is not sufficient to inject electric charges into the floating gate of this transistor. The transistor FGT31' undergoes a non-cumulative stress effect (NCS) due to the difference in potential of 15V between the substrate PW and its control gate. However, as its drain region n1 is linked to the ground through the bit line BL', the conductive channel that is created in its channel region CH1 is kept to 0V and limits the injection of electrons into its floating gate. This stress effect that is known per se in prior art is said to be "non-cumulative" because it is only exerted on memory cells linked to the same control gate line as the transistor being programmed. It is thus generally tolerated.

Therefore, it has been shown above that UCP memory cells comprising a buried vertical gate SGC and a source line formed by the isolation layer NISO can be used to produce a memory. It has further been shown that such memory cells do not have more operating requirements than standard UCP memory cells, in reading, erasing and programming modes, particularly in terms of soft stress SST or non-cumulative stress NCS.

FIGS. 13A to 13L represent in cross-sections steps of a method for manufacturing vertical gates of selection transistors, according to one embodiment. FIGS. 13B to 13L represent a transverse cross-section (on the left on the drawing) and a longitudinal cross-section (on the right). During a step S10, FIG. 13A, an N-doped isolation layer NISO is implanted in the wafer WF, to delimit a P-type well PW forming a substrate. The vertical walls of the isolation layer NISO are not represented in the cross-section in FIG. 14A, which only represents a part of the wafer. Optionally, a P-doped layer is also implanted in the well, above the layer NISO. This layer enables the threshold voltages of the selection transistors ST31, ST32 previously described, and the threshold voltage of the blank cells (threshold voltage of the floating-gate transistors in the absence of electric charges trapped in their floating gates) to be adjusted. During step S10, insulating layers 10, 11 are successively deposited on the substrate PW. The layer 10 may be made of silicon oxide and the layer 11 may be made of silicon nitride ($Si_3N_4$).

Figure 13A:
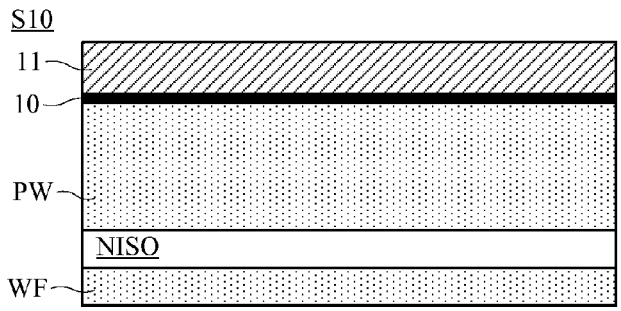
Figure 13B:
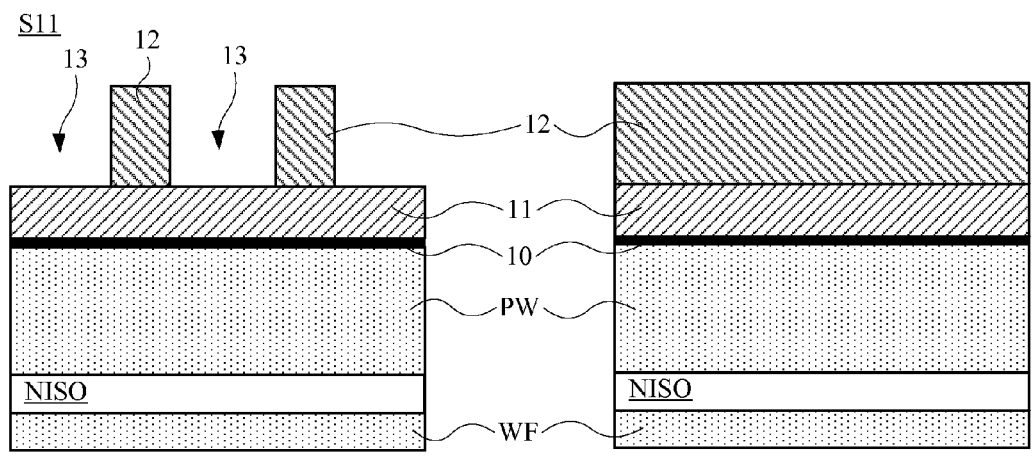

During a step S11, FIG. 13B, an etching resist 12 is deposited on the substrate PW. Trenches 13 that are parallel to one another in the longitudinal direction are etched on the etching resist 12.

Figure 13C:
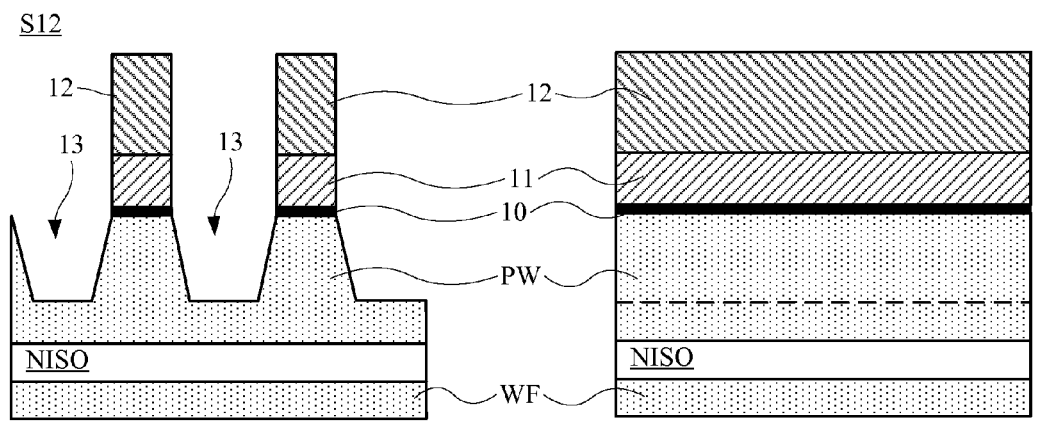

During a step S12, FIG. 13C, the layers 11, 10 and the substrate PW are etched through the etching resist 12 to deepen the trenches 13. The depth of the trenches 13 in the substrate 13 is determined by the desired height of shallow trench isolation (STI) trenches described below, to be formed between the memory cells linked to different bit lines BL.

Figure 13D:
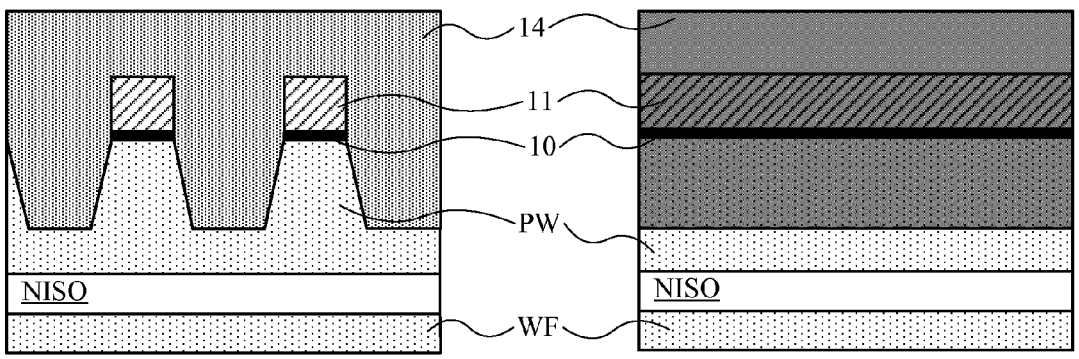

During a step S13, FIG. 13D, the etching resist 12 is removed and an insulating layer 14 (for example made of silicon oxide) is deposited on the layer 11 and in the trenches 13. The insulating layer 14 in the trenches 13 will form the isolation trenches STI.

Figure 13E:
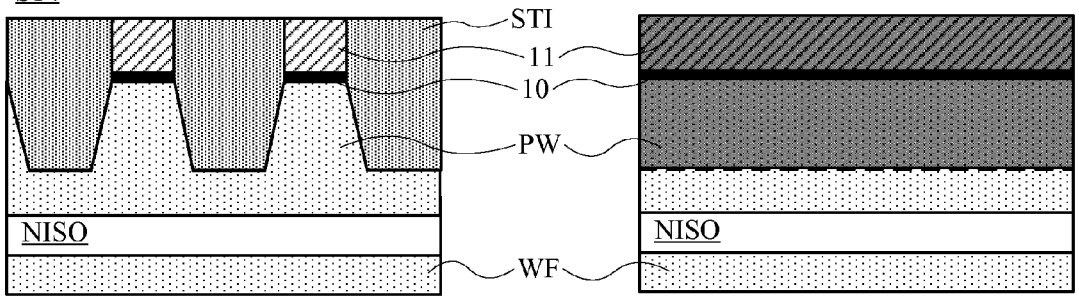

During a step S14, FIG. 13E, the insulating layer 14 is removed from the layer 11 by a classic method of chemical and/or mechanical planarization (CMP), such that the trenches 13 remain filled with the insulating material 14.

Figure 13F:
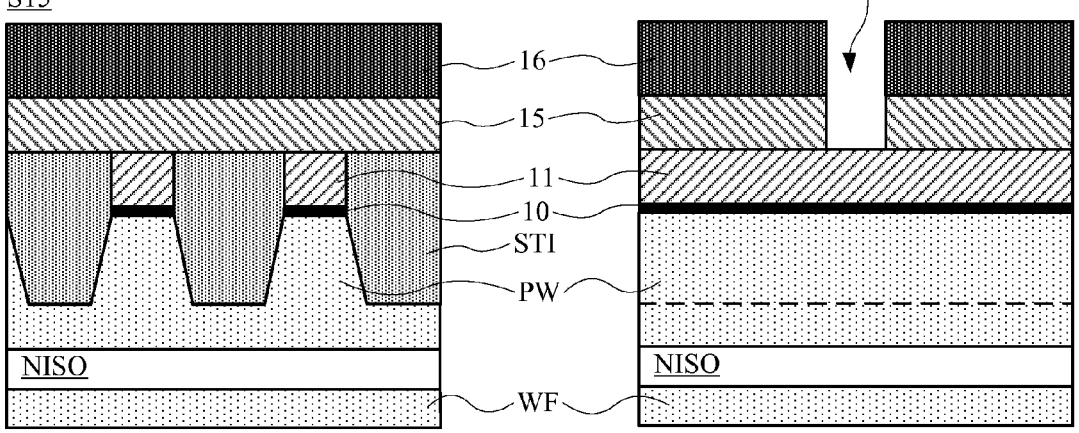

During a step S15, FIG. 13F, layers of hard resist 15 and light-sensitive resin 16 are deposited on the layer 11 and the isolation trenches formed by the trenches 13 filled in by the layer 14. The layer 16 is used to etch trenches 17 parallel to one another, in the transversal direction, in the layer of hard resist 15.

Figure 13G:
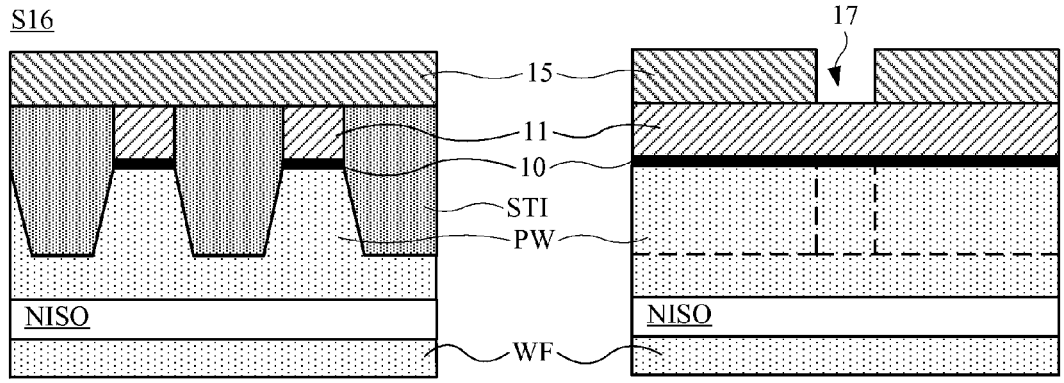

During a step S16, FIG. 13G, the etching resist 16 is removed by a selective etching method that does not attack the strips of nitride 11 and the layer of hard resist, but only the layers of silicon oxide 14, the substrate PW and partly the layer NISO. The trenches 17 are thus deepened between the strips of nitride 11.

Figure 13H:
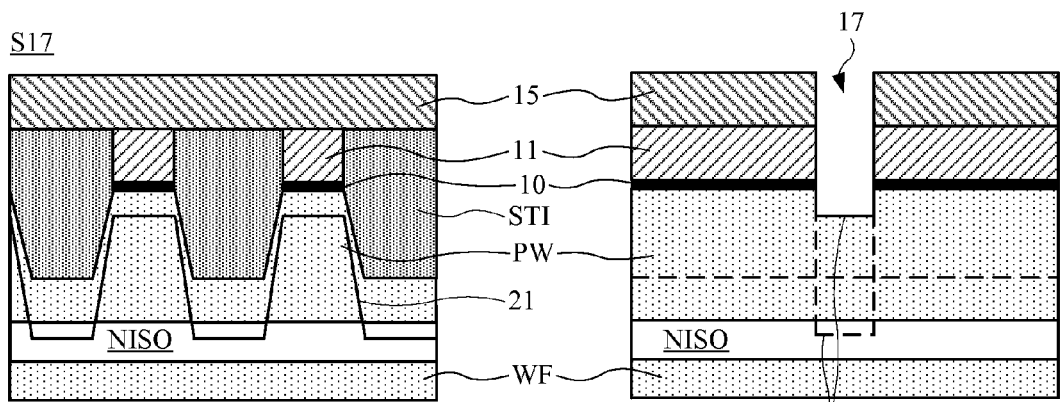

During a step S17, FIG. 13H, the trenches 17 are further deepened in a homogeneous manner, by attacking the strips of nitride 11 and oxide 10, and between the strips of nitride to reach the layer NISO. The bottom 21 of the trenches 17 thus delimits the lower face of the gates SGC comprising the parts G1 (between the strips of nitride 11) and G2 (beneath the strips of nitride).

Figure 13I:
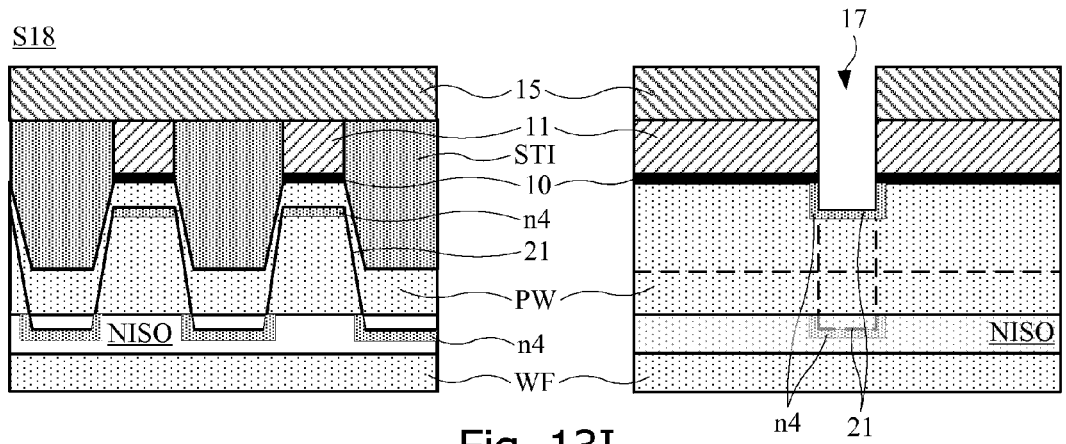

The step S18, FIG. 13I, consists in implanting doped semiconductor pockets n4 around the bottom 21 of the trenches 17. These pockets will form the drain and source regions of the selection transistors. The pockets n4 are for example implanted by passing through the inside and the bottom 21 of the trenches 17.

Figure 13J:
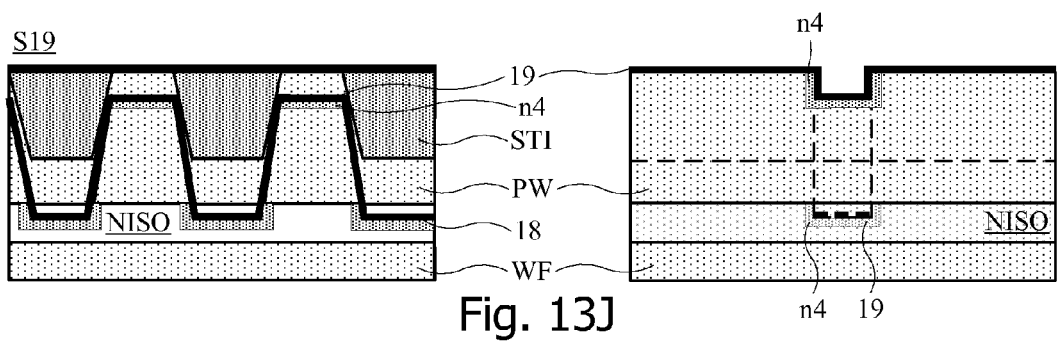

During a step S19, FIG. 13J, a gate oxide layer 19 is deposited on the substrate PW and in the trenches 17.

Figure 13K:
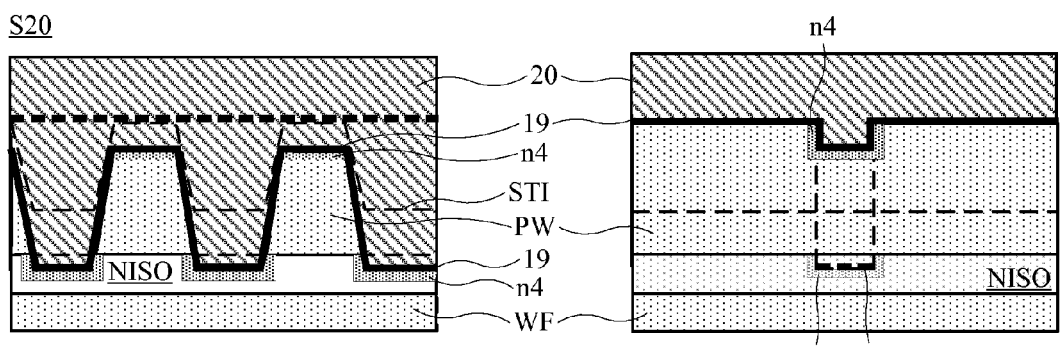

During a step S20, FIG. 13K, a layer of polycrystalline silicon 20 is deposited on the substrate PW and in the trenches 17, above the oxide layer 19 to form the gates SGC.

Figure 13L:
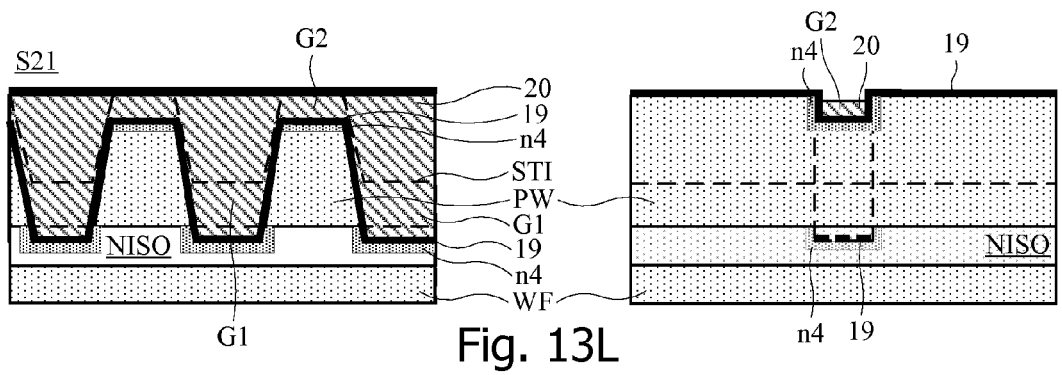

During a step S21, FIG. 13L, the layer of polycrystalline silicon 20 is removed from the surface of the substrate PW, as is the oxide layer 19, so that the surface of the substrate is ready for other manufacturing steps described below. The conductive trenches 17, filled with polycrystalline silicon 20, isolated from the substrate by the oxide layer 19, form vertical gates SGC comprising the parts G1, G2 thus remain, as represented in FIGS. 6, 7A and 7B.

It shall be noted that the length of the gates of the selection transistors ST is determined by the difference in depth in the parts G1 and G2. This difference can be easily adjusted during steps S15 and S16, depending on the thickness of the layer 16 and/or the duration of the etching done in step S16. Keeping the layer 11 after etching in step S12, and until step S18, enables the parts G1 of the gate SGC trenches to be automatically aligned with the trenches STI, and the parts G2 with the spaces between the trenches STI.

Steps of a method for manufacturing memory cells in an integrated circuit are shown by FIGS. 14A to 14E representing top views of the substrate. This method aims to collectively manufacture memory cells, to produce a memory of the type described below in relation with FIGS. 19 and 20. During a step S30, FIG. 14A, shallow isolation trenches STI are formed in the substrate PW. The trenches STI can be formed in accordance with the manufacturing method that has just been described with reference to FIGS. 13A to 13E. The trenches STI generate in the substrate parallel semiconductor strips $DS_j$, $DS_{j+1}$ that later form the drain and source regions of transistors.

During a step S31, FIG. 14B, conductive trenches $SGC_{i,i+1}$, $SGC_{i+2,i+3}$ isolated from the substrate and perpendicular to the trenches STI are formed in the substrate PW. The conductive trenches $SGC_{i,i+1}$, $SGC_{i+2,i+3}$ can be formed in accordance with the manufacturing method that has just been described with reference to FIGS. 13F to 13L. For the sake of simplicity of the drawings, only two trenches are represented. These trenches, noted with subscripts (i, i+1) and (i+2, i+3), relate to the manufacturing of four pages or four words of ranks i, i+1, i+2, and i+3.

The etching of the conductive trenches $SGC_{i,i+1}$, $SGC_{i+2,i+3}$ also etches the isolation trenches STI in intersection areas. For a better understanding, FIGS. 15A and 15B are a transverse cross-section and a longitudinal cross-section of the conductive trenches, according to cutting planes AA' and BB' represented in FIG. 14B. The conductive trenches $SGC_{i,i+1}$, $SGC_{i+2,i+3}$ are deeper than the isolation trenches STI and section them entirely.

During a step S32, FIG. 14C, conductive lines $CG_i$, $CG_{i+1}$, $CG_{i+2}$, $CG_{i+3}$ parallel to the conductive trenches $SGC_{i,i+1}$, $SGC_{i+2,i+3}$ are formed on the substrate PW, with two conductive lines per conductive trench, one being placed to the left and the other one to the right of the conductive trench. These conductive lines are formed by depositing a layer of level-2 polycrystalline silicon or "poly2", then etching it into strips. They form both control gates of floating-gate transistors and control gate lines CGL. The step S32 is preceded by steps of forming floating gates that are not represented in the figures, performed after the step S31. These steps include depositing a tunnel oxide layer on the substrate, depositing a first layer of polycrystalline silicon or "poly1", etching the "poly1" layer to form floating gates, then depositing on the substrate an oxide layer, for example of ONO type (Oxide-Nitride-Oxide), on which the conductive lines $CG_i$ to $CG_{i+3}$ are formed.

During a step S33, FIG. 14D, N-type dopants are implanted in the semiconductor strips $DS_j$, $DS_{j+1}$, to form drain n1 and source n2 regions of floating-gate transistors. The source regions n2, which extend to the right and left of the conductive trenches $SGC_{i,i+1}$, $SGC_{i+2,i+3}$, also form drain regions of selection transistors, in accordance with the memory cell structure represented in FIGS. 6, 7A and 7B.

During a step S34, FIG. 14E, the entire substrate, including the conductive lines $CG_i$, $CG_{i+1}$, $CG_{i+2}$, $CG_{i+3}$, is covered with the dielectric layer D0 mentioned above. This dielectric layer is not represented on the diagram so as to show the elements it covers. Orifices are formed in the dielectric layer, and the orifices are then metalized to form the contacts C1, C3, C4 (Cf FIG. 8) that connect the elements that have just been formed to metal conductive paths. Therefore, the contacts C1 connect the drain regions n1 to bit lines. The contacts C4 connect the conductive lines $CG_i$, $CG_{i+1}$, $CG_{i+2}$, $CG_{i+3}$ to a control gate circuit. The contacts C3 connect the conductive trenches $SGC_{i,i+1}$, $SGC_{i+2,i+3}$ to a word line driver circuit.

More precisely, if the conductive trenches are totally sectioned by the isolation trenches STI, the contacts C3 enable them to be linked to metal word lines leading to the word line driver circuit. In this case, additional contacts C3' are provided to link the sections formed by the sectioned conductive trenches to the word lines. Conversely, if the conductive trenches are not totally sectioned, they can be used as word lines. The contacts C3 then enable them to be linked to the word line driver circuit.

The steps that have just been described are followed by steps of forming metal lines as mentioned below, or interconnection lines enabling the memory cells to be linked to control units of the integrated circuit. These steps, which are classic in themselves, will not be described.

Figure 16:
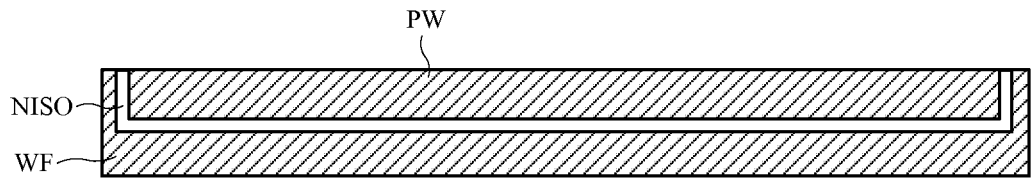
FIG. 16 is a cross-section of a well receiving memory cells.
Figure 17:
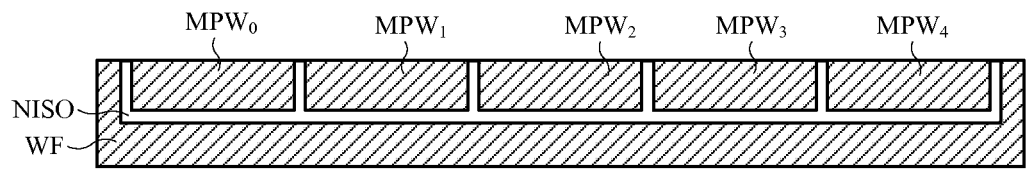
FIG. 17 is a cross-section of a plurality of wells receiving memory cells.

FIG. 16 shows a step of forming, in the wafer WF, the layer NISO that delimits the well PW. The layer NISO is formed by two implantations of N-type dopants. A first implantation enables a horizontal "wafer" of doped semiconductor to be formed that delimits the bottom of the well PW. A second implantation enables vertical walls of the well PW to be formed. In one alternative embodiment represented in FIG. 17, the layer NISO comprises a plurality of "walls" that delimit a plurality of wells $PW_0$, $PW_1$, $PW_2$, etc. It will be seen below that some embodiments of a memory according to the present disclosure include such a plurality of wells, each one being capable of being taken to an electric potential different from that of the others.

Figure 18:
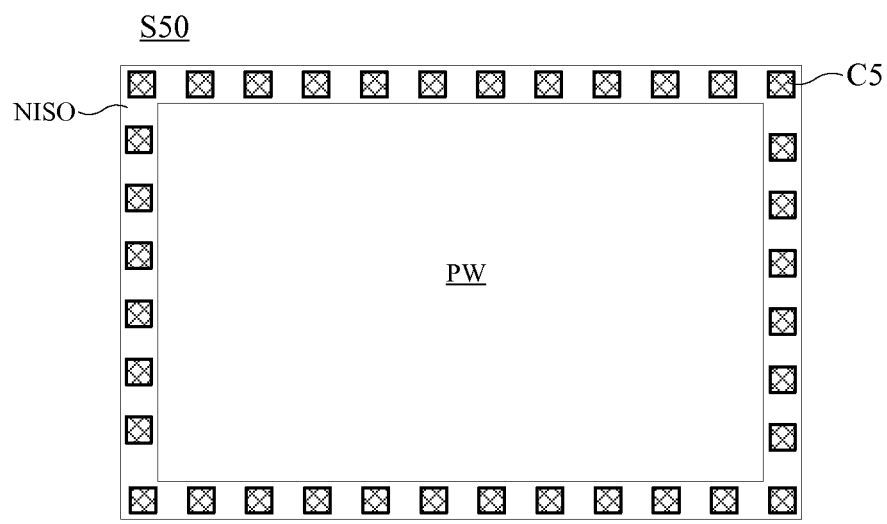
FIG. 18 is a top view of a well.

FIG. 18 shows a step of forming contacts C5 on the upper edge of the walls of the isolation layer NISO. This step can be done at the same time as the step of forming contacts C1, C3, C4 shown in FIG. 14E. The layer NISO being used as source line, many contacts C5 are preferably provided along the upper edge of the walls of the layer NISO, as represented in the Figure, so as to reduce its electrical resistance and favor the distribution of current lines in all directions. As indicated above, the contacts C5 enable the layer NISO to be linked to a main source line SL formed in a level of metal, or to control units for controlling the source line voltage.

Figure 19:
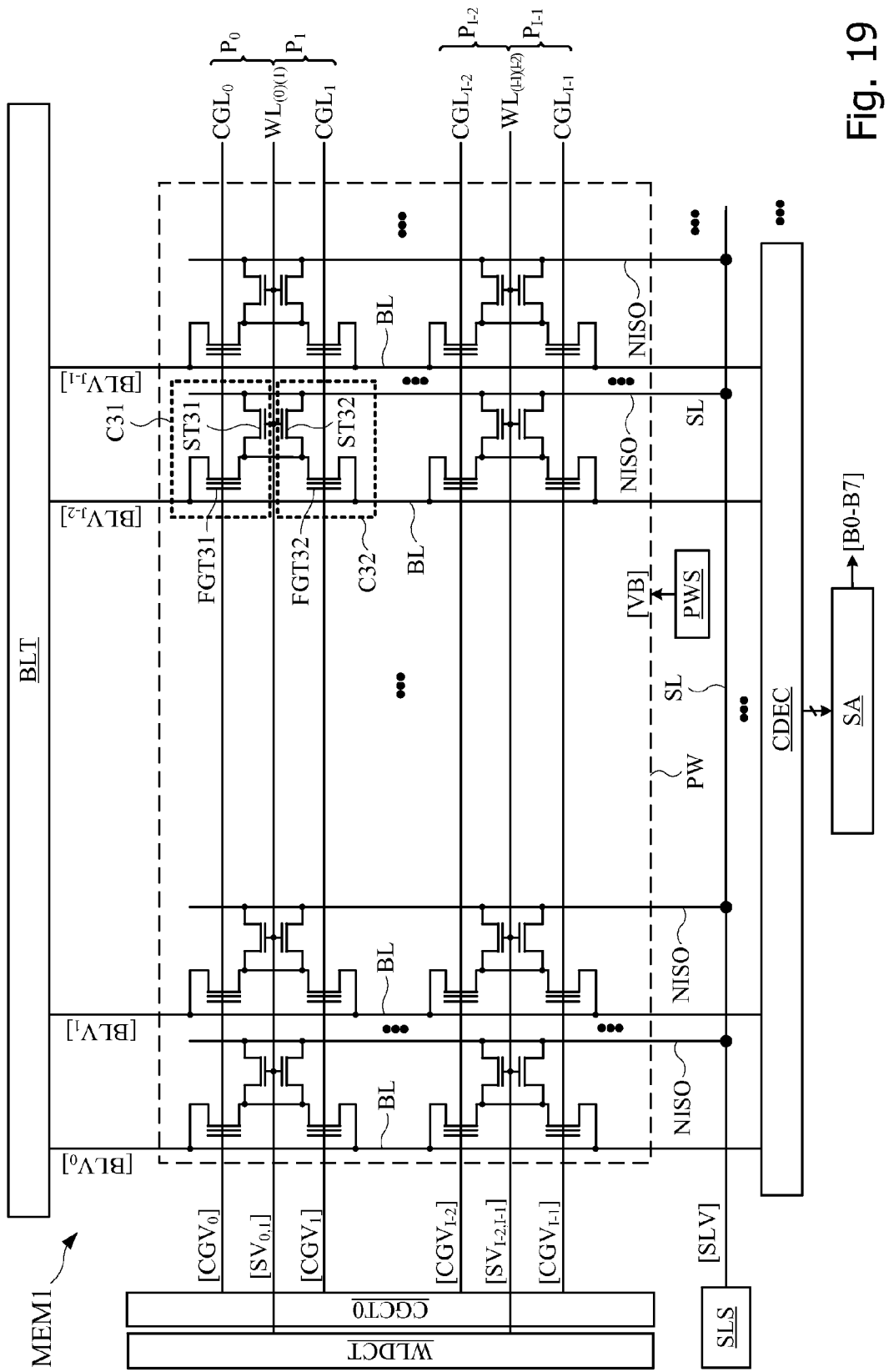
FIG. 19 is the wiring diagram of a page-erasable memory according to the present disclosure.

FIG. 19 represents a page-erasable memory MEM1 comprising a memory array formed in a well PW. The memory array comprises M×N memory cells C31, C32 according to the present disclosure, each memory cell C31, C32 comprising a charge accumulation transistor FGT31, FGT32 in series with two selection transistors ST31, ST32 common to two adjacent memory cells.

The memory MEM1 comprises M pages P each comprising a row of N memory cells, and a control gate line CGL. FIG. 19 shows the first two pages P0, P1 of ranks 0 and 1, and two pages of ranks I-2 and I-1. The memory also comprises N bit lines BL, each being linked to memory cells of the same rank J belonging to different pages. FIG. 19 shows the first two bit lines of ranks 0 and 1 and two adjacent bit lines of ranks J-2 and J-1. Each bit line BL is connected to the drain regions of the floating-gate transistors FGT of memory cells of the same rank j, whereas each control gate line CGL is connected to the control gates of the transistors FGT of memory cells of the same rank i. The source regions of the selection transistors are connected to the layer NISO surrounding the well PW.

The memory MEM1 further comprises word lines WL that are connected to the gates of the selection transistors ST of the memory cells. Each word line WL controls the common selection gate of memory cells of two neighboring pages, or "linked" pages. Therefore, a word line WL of rank (0)(1) is associated with the first two pages of rank 0 and 1 and controls the selection transistors of the memory cells of these two linked pages. Similarly, a word line of rank (I-2)(I-1) is associated with the two pages of rank I-2 and I-1 and controls the selection transistors of the memory cells of the two linked pages.

The voltages applied to the various control lines of the memory array are supplied by units of the memory according to an address of a page to be erased or to a group of memory cells to be read or programmed. These units comprise:
  bit line latches BLT that apply to the different bit lines BL the appropriate voltages BLV when programming memory cells,
  a word line driver circuit WLDCT that applies to the different word lines WL the voltages SV intended for the selection transistors,
  a control gate circuit CGCT0 that applies to the different control gate lines CGL the control gate voltages CGV of the floating-gate transistors,
  a source line switch SLS that applies the source line voltage SLV to the layer NISO,
  a well switch PWS that applies the substrate voltage VB to the well PW,
  sense amplifiers SA that apply to the different bit lines BL the appropriate voltages BLV when reading memory cells, and supply a binary word read in the memory, for example an 8-bit word B0-B7, and
  a column decoder CDEC, which links the sense amplifiers SA to the different bit lines.

The voltages supplied by these different units are described in Tables RD4, ER2, PG2 and PG2'. In particular, the bit line latches BLT supply the "bias voltage during the programming" or the "non-programming voltage" appearing in Tables PG2 and PG2'. The sense amplifiers SA supply the "reading bias voltage" appearing in Table RD4.

It will be understood by those skilled in the art that this memory structure comprising a word line WL common to two rows of neighboring memory cells (for example the pages $P_0$, $P_1$), in which the common word line is connected to gates of selection transistors ST31, ST32 common to the first row and to the second row, can be changed to receive memory cells C21, C22 of the type described above in relation with FIG. 5, the selection transistors ST21, ST22 of which do not have any common gate but share the same word line WL.

Figure 20:
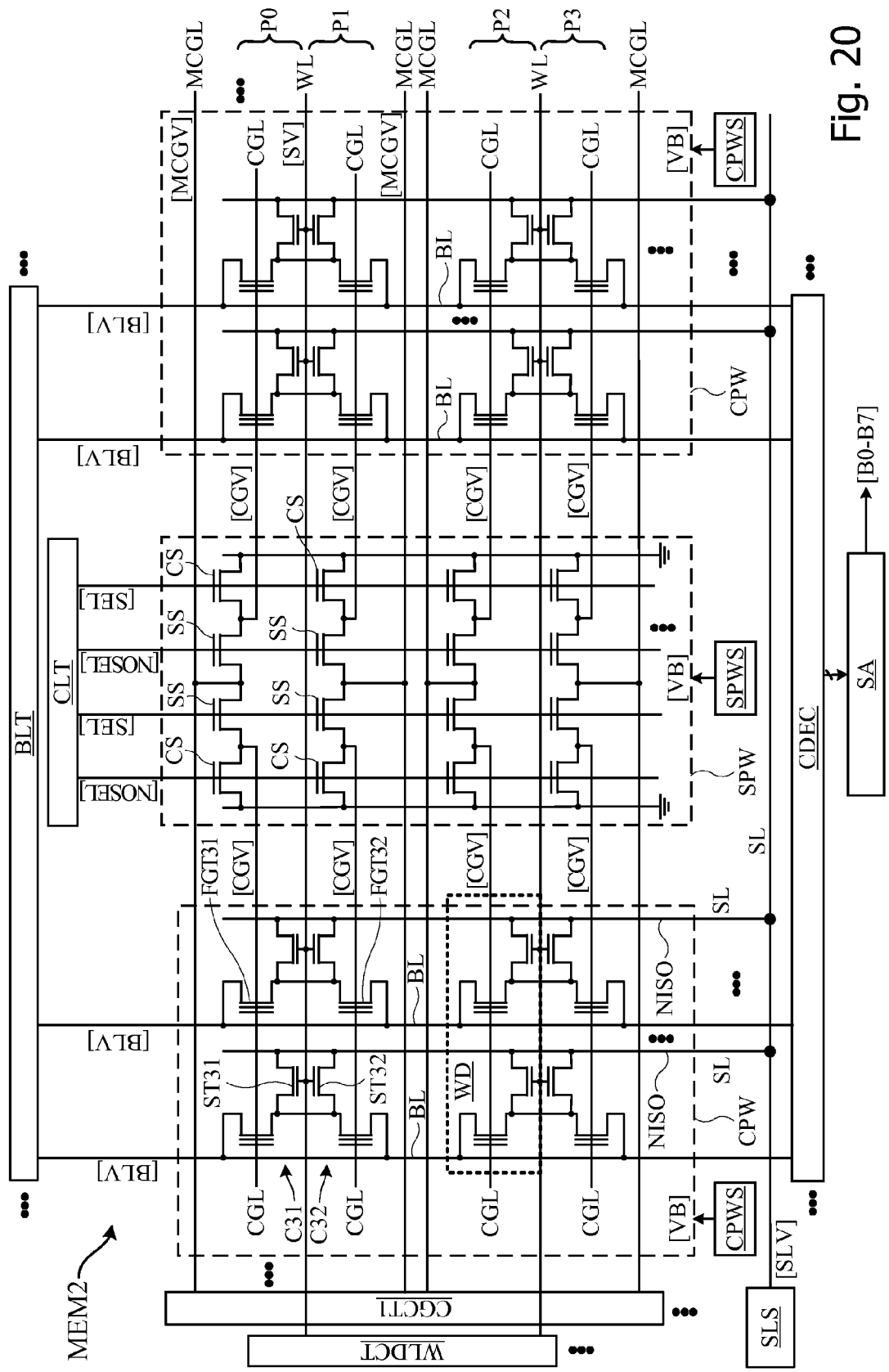
FIG. 20 is the wiring diagram of a word-erasable memory according to the present disclosure.

FIG. 20 represents a word-erasable memory MEM2 comprising a memory array formed in a plurality of wells CPW. Each well CPW comprises memory cells C31, C32 according to the present disclosure, each comprising a charge accumulation transistor FGT31, FGT32 in series with a selection transistor ST31, ST32. The memory also comprises wells SPW receiving control switches. The structure of the memory array is of the CPW-SPW-CPW/CPW-SPW-CPW/CPW-SPW-CPW/etc. type, a control well being associated with two wells of memory cells and arranged between them (for the sake of legibility, FIG. 20 represents only one well SPW and two wells CPW). In one alternative, the structure of the memory array could be of the CPW-SPW/CPW-SPW/CPW-SPW/etc. type, by providing one control well per well of cells.

The structure of each well CPW is similar to the structure of the memory array of the page-erasable memory MEM1, but the pages are replaced with words WD, i.e., a group of memory cells containing a number of memory cells lower than the number of memory cells of a page, for example 8 memory cells. A page of the memory MEM2 is thus made up of a plurality of words WD. FIG. 20 shows the first four pages $P_0$, $P_1$, $P_2$, $P_3$ of the memory array.

More particularly, each page comprises:
  a plurality of words WD spread in different wells CPW,
  control gate lines CGL each allocated to one word WD,
  a main control gate line MCGL which passes through the entire memory array and supplies a main control gate voltage MCGV to the different control gate lines CGL, and
  a word line WL, shared with a neighboring page, which passes through the entire memory array.

Each well CPW comprises a word WD from each page. Each memory cell of each word is linked to a bit line BL, to the control gate line CGL, common to all the memory cells of the word, and to the layer NISO of the well. The control gate line CGL of the word is linked to the main control gate line MCGL of the page to which the word belongs, through the control well SPW.

The control well SPW comprises:
  a first vertical row of switch transistors CS controlled by a common signal NOSEL, provided to control the lines CGL of the well of cells located on the left of the control well,
  a first vertical row of switch transistors SS controlled by a common signal SEL, also provided to control the lines CGL of the well of cells located on the left of the control well,
  a second vertical row of switch transistors CS controlled by a common signal NOSEL, provided to control the lines CGL of the well of cells located on the right of the control well, and
  a second vertical row of switch transistors SS controlled by a common signal SEL, also provided to control the lines CGL of the well of cells located on the right of the control well.

More precisely, each switch CS links a line CGL to the ground, and each switch SS links a line CGL to the main control gate line MCGL of the page to which the word considered belongs. The combination of the signals SEL and NOSEL thus enables the line CGL to be grounded or to be linked to the main control gate line MCGL.

The voltages applied to these various lines of the memory array are supplied by units of the memory according to a selection address for selecting a word to be erased, read or programmed. These units comprise:
  bit line latches BLT, that apply to the different bit lines BL the appropriate voltages BLV when programming memory cells,
  a word line driver circuit WLDCT that applies to the different word lines WL the selection voltages SV intended for the selection transistors,
  a control gate circuit CGCT1, that applies control gate voltages CGV to the different main control gate lines MCGL,
  column latches CLT that supply each vertical row of switches CS, SS with the signals SEL and NOSEL.
  a source line switch SLS that applies the source line voltage SLV to the layer NISO of all the wells,
  one well switch CPWS per well CPW, that applies the substrate voltage VB to the well CPW,
  one well switch SPWS per well SPW, that applies the substrate voltage VB to the well CPW,
  sense amplifiers SA, that apply to the different bit lines BL the appropriate voltages BLV when reading memory cells, and supply a binary word read in the memory, for example an 8-bit word B0-B7, and
  a column decoder CDEC, which links the sense amplifiers to the different bit lines.

Figure 21:
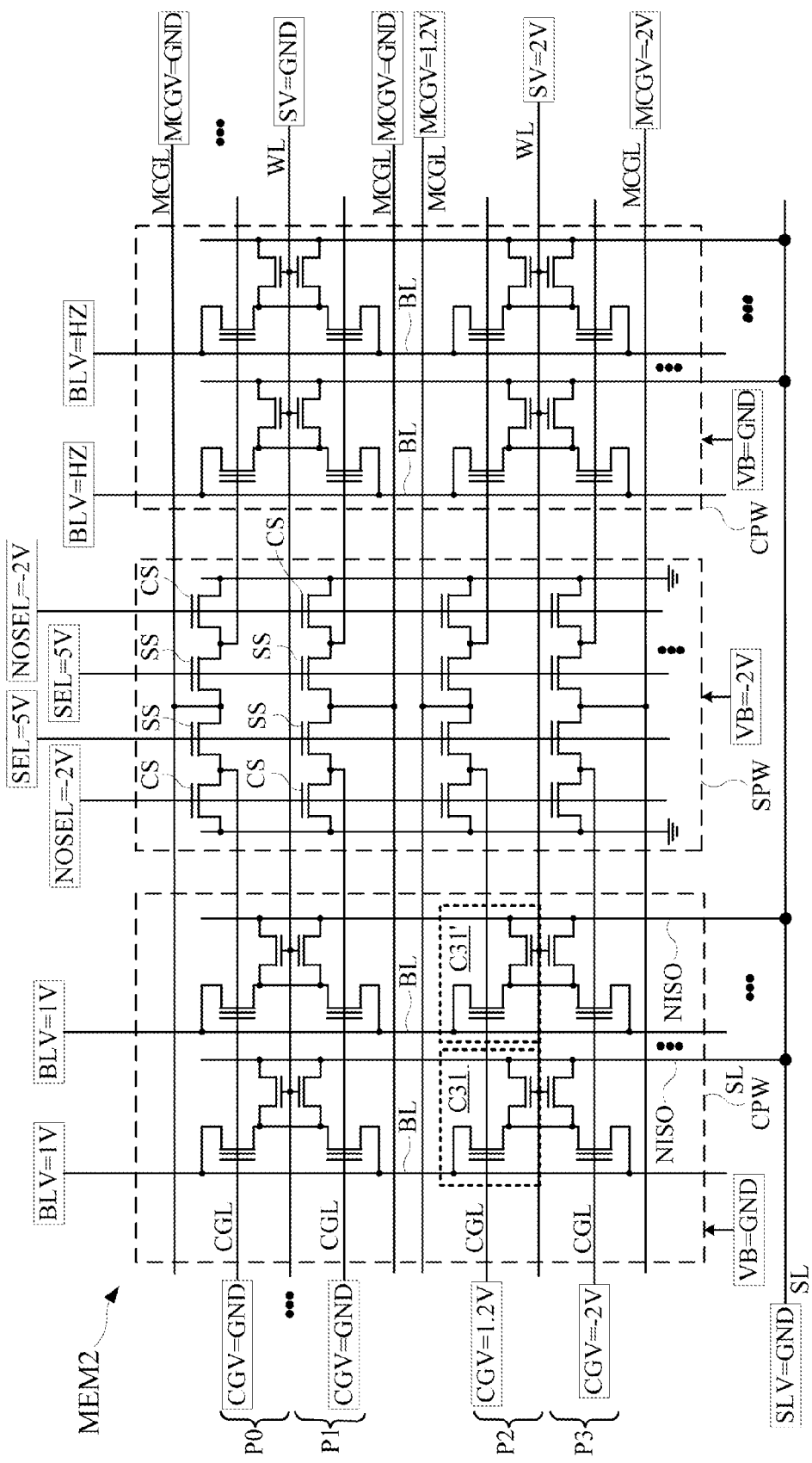
FIGS. 21, 22 and 23 show voltages applied to the memory in FIG. 20 during phases of reading, erasing and programming memory cells.

The memory array thus organized enables the previously described methods of reading, erasing and programming to be applied to the memory cells. Table RD5 in Appendix 1 describes in relation with FIG. 21 values of voltages applied to the memory array when reading memory cells. FIG. 21 shows the distribution of these values of voltages when reading two memory cells C31, C31' that are framed in the figure.

Figure 22:
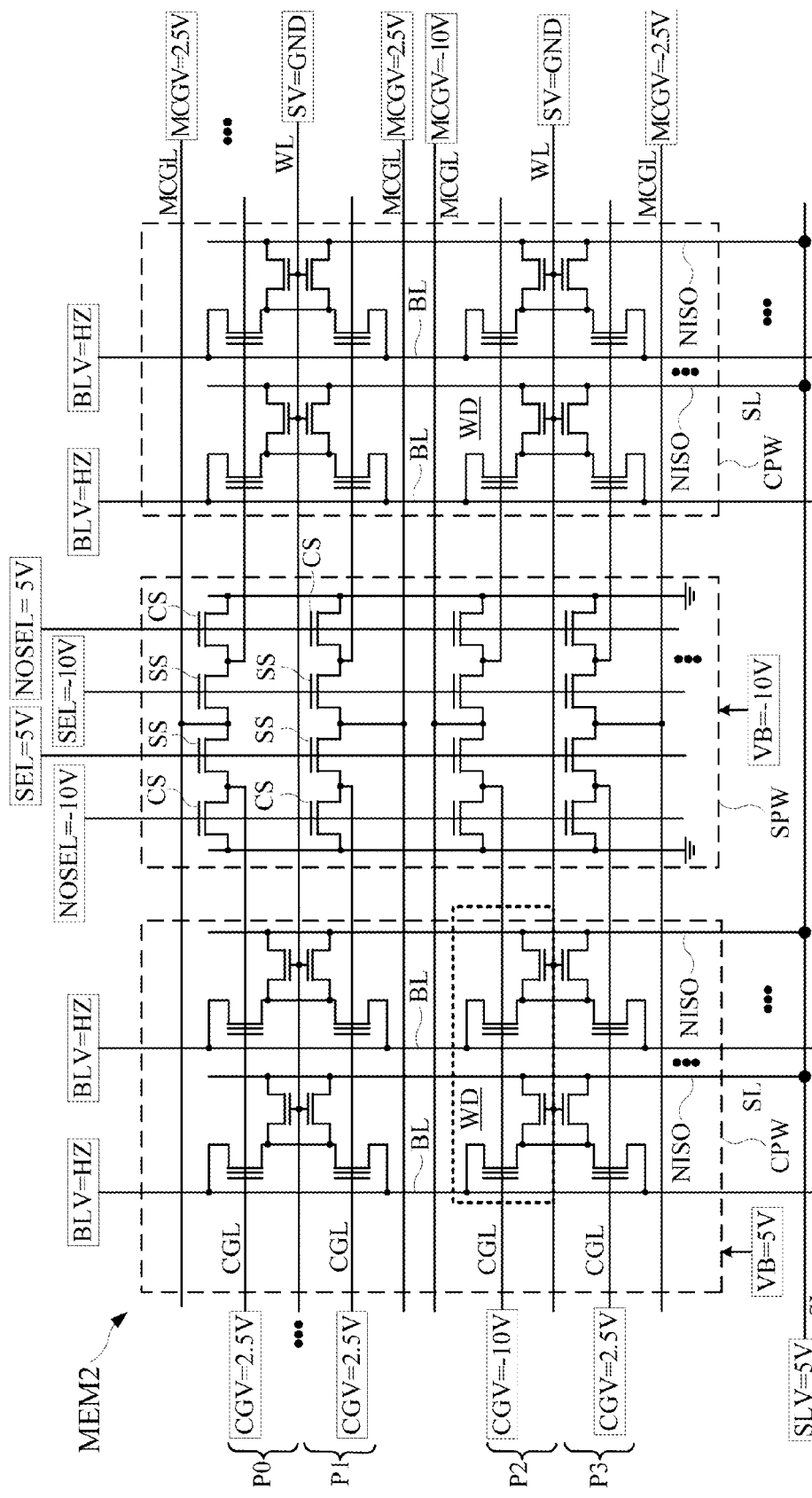

Table ER3 in Appendix 1 describes in relation with FIG. 22 values of voltages applied to the memory array when erasing a word. FIG. 22 shows the distribution of these values of voltages when erasing a word WD that is framed in the figure.

Figure 23:
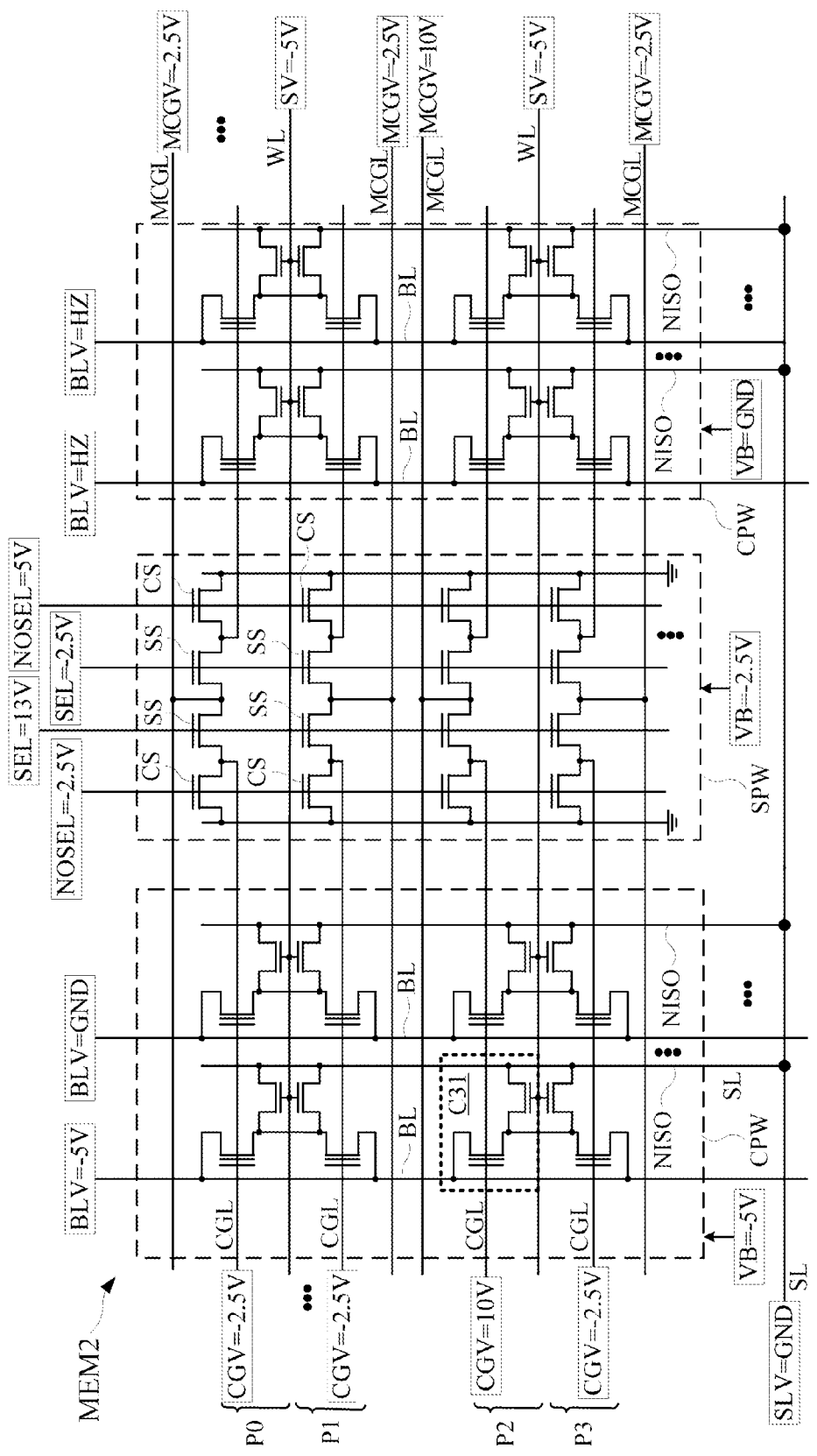

Table PG3 in Appendix 1 describes in relation with FIG. 23 examples of values of voltages applied to the memory array when programming a memory cell. FIG. 23 shows the distribution of these values of voltages when programming a memory cell C31 that is framed in the figure.

It appears in Table RD5 that when reading memory cells, a control gate line not selected but linked to the control gate line selected requires a voltage different from that applied to a non-selected control gate line.

In one alternative of the manufacturing method previously described, memory cells are formed in mini wells that are electrically isolated from each other by the isolation trenches STI. To obtain this feature, during the step of forming isolation trenches STI described above (Cf FIGS. 13C, 14B), the depth of the isolation trenches STI is greater than the depth of the conductive trenches $SGC_{i,i+1}$, $SGC_{i+2,i+3}$. The depth of the trenches STI and $SGC_{i,i+1}$, $SGC_{i+2,i+3}$ is also sufficient to reach the layer NISO (Cf. FIGS. 13G, 13H).

Figure 24A:
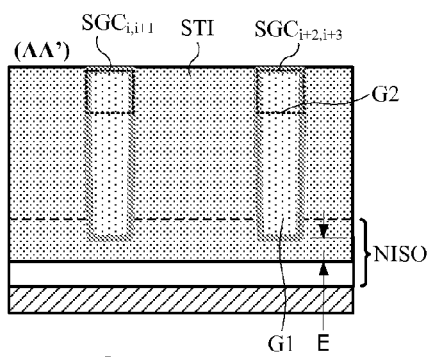
FIGS. 24A, 24B are cross-sections showing a step represented in FIG. 14A, according to another embodiment.
Figure 24B:
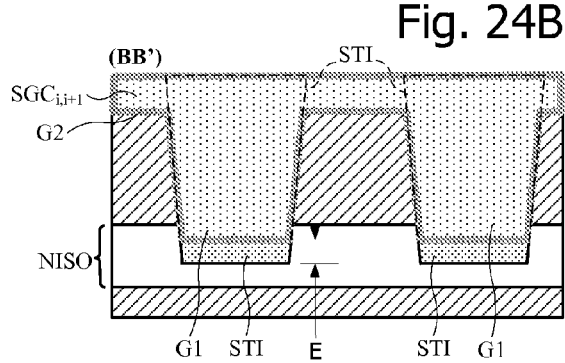

This alternative of the manufacturing method is shown in FIGS. 24A, 24B, in relation with the manufacturing method represented in FIGS. 14A to 14E. FIGS. 24A and 24B are transverse and longitudinal cross-sections of the isolation trenches STI according to the cutting planes AA' and BB' represented in FIG. 14B.

Therefore, in FIGS. 24A, 24B, the isolation trenches STI reach the layer NISO to a depth greater than that of the conductive trenches $SGC_{i,i+1}$, $SGC_{i+2,i+3}$. The isolation trenches STI or the conductive trenches $SGC_{i,i+1}$, $SGC_{i+2,i+3}$, or both, may even be of a depth such that they exceed the layer NISO. The fact that the isolation trenches STI reach the layer NISO then generates, in the well PW, a plurality of mini wells $PW_0$, $PW_1$, $PW_2$ (FIG. 17) that are isolated in the three dimensions from each other, by the isolation trenches STI, and the layer NISO itself. The result is that the memory cells connected to a same bit line BL are isolated in a respective mini well from the memory cells connected to the other bit lines. Furthermore, due to the fact that the trenches STI are deeper than the conductive trenches $SGC_{i,i+1}$, $SGC_{i+2,i+3}$, the lower end of the deep parts G1 in the layer NISO is covered by an insulating layer formed by an isolation trench STI. This arrangement avoids the formation of a spurious MOS transistor in the layer NISO between two mini wells. A thickness E of insulant in the order of 100 to 200 nm over the lower end of the deep parts G1 proves sufficient to prevent such a spurious transistor from appearing.

Figure 25:
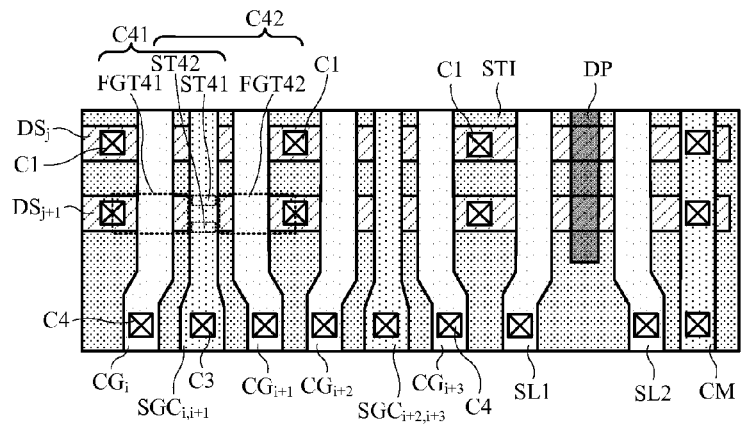
FIG. 25 is a top view of ends of two wells according to the embodiment shown by FIGS. 24A, 24B.

FIG. 25 is a top view of ends of bit line mini wells MPW. FIG. 25 represents memory cells C41, C42 such as those represented in FIG. 14E, but changed in accordance with the embodiment of FIGS. 24A, 24B. More precisely, each memory cell C41, C42 comprises a floating-gate transistor FGT41, FGT42 and two selection transistors ST41, ST42 common to a pair of memory cells. The transistors FGT41, FGT42 are of the same structure as the transistors FGT31, FGT32 described above and each has a horizontal channel region CH1 extending beneath their floating gate FG, between the drain n1 and source n2 regions. The selection transistors ST41, ST42 have the structure changed in accordance with the embodiment of FIGS. 24A, 24B, with a buried vertical gate SGC that reaches the layer NISO. The transistors ST41, ST42 have respective vertical channel regions CH2 located along vertical walls opposite two adjacent parts G1 of the gate SGC. The bit line BL is formed in a level of metal and the drain regions n1 of the transistors FGT41, FGT42 of each pair of memory cells are linked to the bit line BL through contacts and conductive vias of a type already described.

Each pair of memory cells C41, C42 thus differs from the pair of memory cells C31, C32 in that the isolation trenches STI reach the layer NISO to a depth greater than that of the conductive trenches $SGC_{i,i+1}$, $SGC_{i+2,i+3}$, as represented by a horizontal dotted line showing the depth of the layer NISO in FIG. 24A. The result is that all the memory cells connected to a same bit line BL are located in a same mini well MPW distinct from the other mini wells in which the other memory cells are formed.

The isolation trenches STI are extended to the edge of the memory array, so as to isolate the semiconductor strips $DS_j$, $DS_{j+1}$, forming the drain n1 and source n2 regions of the floating-gate transistors. At the end of the semiconductor strips $DS_j$, $DS_{j+1}$, and perpendicularly to them, conductive lines SL1, SL2 are formed by depositing and etching a layer of polycrystalline silicon, so as to form N-channel transistor gates. A P+-doped strip DP is formed between the conductive lines SL1, SL2 to form a substrate tap. The semiconductor strips $DS_j$, $DS_{j+1}$, are interconnected at their end by a common line CM.

Figure 26:
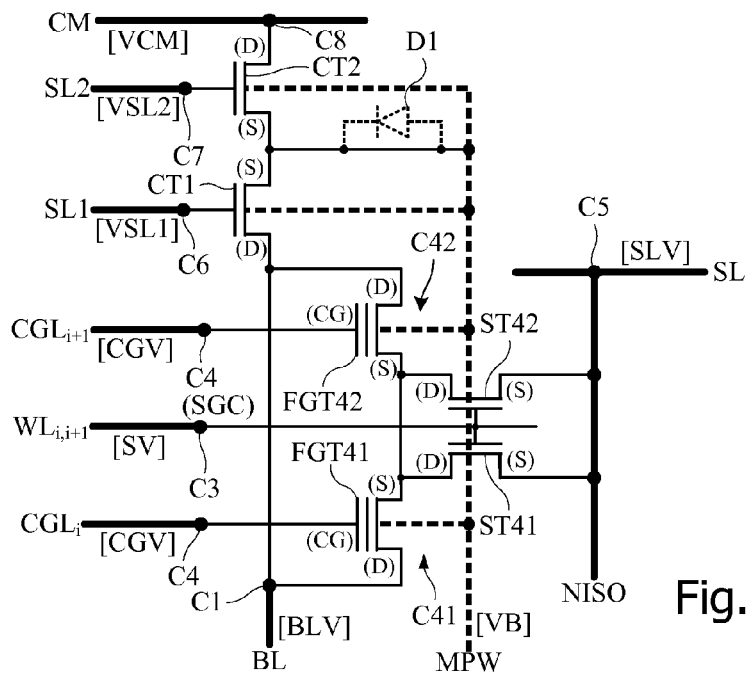
FIG. 26 is the wiring diagram of a well end according to FIGS. 24A, 24B, and 25.

FIG. 26 is the wiring diagram of the end of a bit line BL, as shown by FIG. 25. This wiring diagram comprises memory cells C41, C42 such as those represented in FIG. 8, but changed in accordance with the embodiment of FIGS. 24A, 24B, 25. The semiconductor strip $DS_j$ and the conductive lines SL1, SL2 form transistors CT1, CT2 connected in series. The drain region (D) of the transistor CT1 is connected to the bit line BL. The drain region (D) of the transistor CT2 is connected to the common line CM through a contact C8. The doped strip DP enables the source regions (S) of the transistors CT1, CT2 to be connected to the electric potential of the bit line well MPW. It shall be noted that the junction pn forming a diode D1 between the semiconductor strip $DS_j$ and the strip DP is short-circuited by a conductive layer deposited on the strip $DS_j$, for example a self-aligned silicide. The gate of the transistor CT1 can be connected to a control gate line SL1 through contacts C6. The gate of the transistor CT2 can be connected to a control gate line SL2 through contacts C7.

Figure 27:
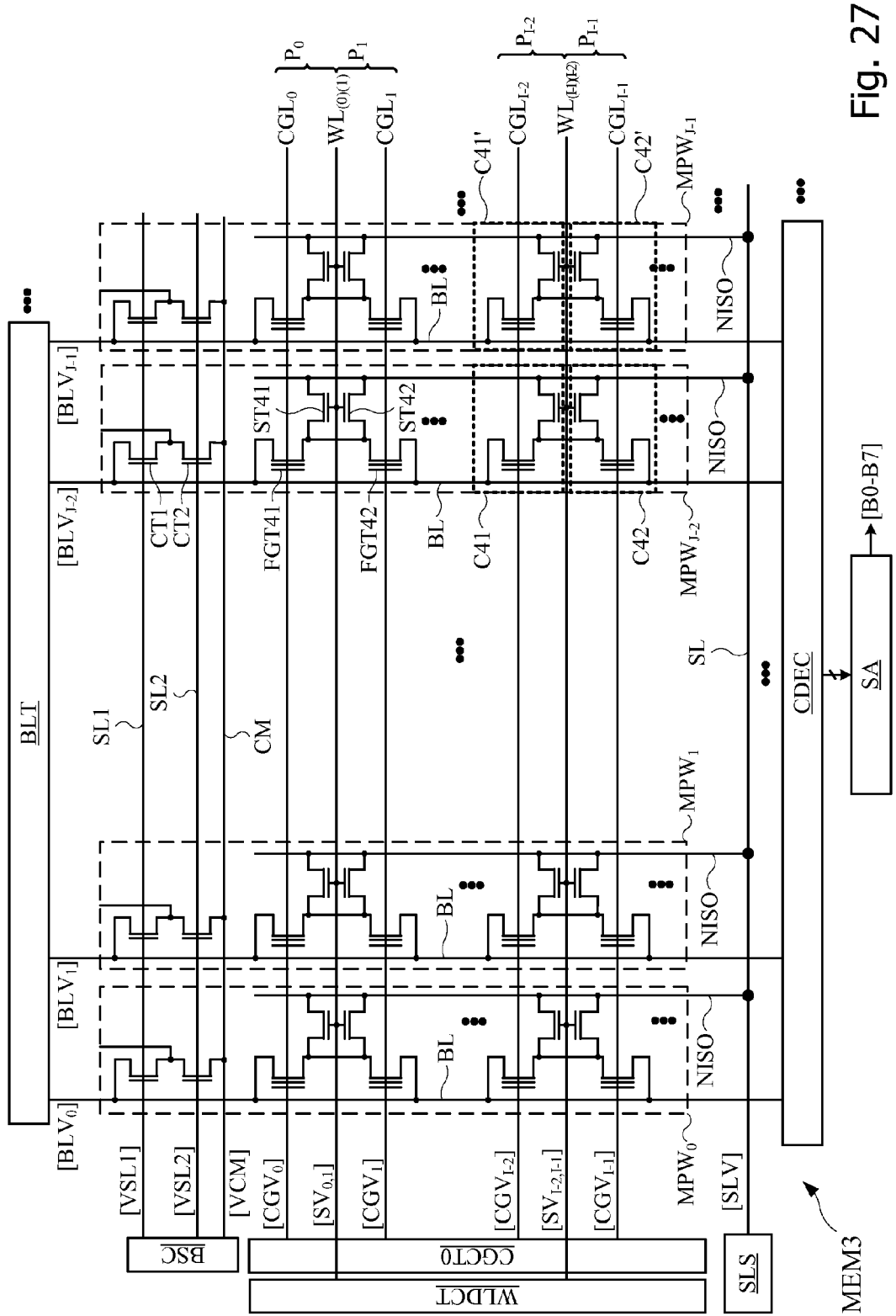
FIG. 27 is the wiring diagram of a bit-erasable memory according to the embodiment of FIGS. 24A to 26, FIGS. 28, 29 and 30 show voltages applied to the memory in FIG. 27 during phases of reading, erasing and programming memory cells.

FIG. 27 represents a bit-erasable memory MEM3 comprising a memory array formed in a plurality of bit line mini wells $MPW_0$, $MPW_1$, etc. $MPW_{j-1}$. The memory array comprises M×N memory cells C41, C42 according to the present disclosure, each memory cell C41, C42 comprising a charge accumulation transistor FGT41, FGT42 in series with two selection transistors ST41, ST42 common to two adjacent memory cells. Each mini well $MPW_0$-$MPW_{j-1}$ comprises several pairs of memory cells C41, C42, and the transistors CT1, CT2.

The memory MEM3 comprises M pages P each comprising a row of N memory cells, and a control gate line CGL. FIG. 27 shows the first two pages P0, P1 of ranks 0 and 1, and two adjacent pages of ranks I-2 and I-1. The memory also comprises N bit lines BL, each being linked to memory cells of the same rank J belonging to different pages. FIG. 27 shows the first two bit lines of ranks 0 and 1 and two bit lines of ranks J-2 and J-1. Each bit line BL is connected to the drain regions of the floating-gate transistors FGT of memory cells of the same rank j, whereas each control gate line CGL is connected to the control gates of the transistors FGT of memory cells of the same rank i. The source regions of the selection transistors are connected to the layer NISO surrounding the wells MPW.

The memory MEM3 also comprises word lines WL that are connected to the gates of the selection transistors ST of the memory cells. Each word line WL controls the common selection gate of memory cells of two neighboring pages, or "linked" pages. Therefore, a word line WL of rank (0)(1) is associated with the first two pages of rank 0 and 1 and controls the selection transistors of the memory cells of these two linked pages. Similarly, a word line of rank (I-2)(I-1) is associated with the two pages of rank I-2 and I-1 and controls the selection transistors of the memory cells of the two linked pages.

The voltages applied to the various control lines of the memory array are supplied by units of the memory according to an address of a memory cell to be read or programmed. These units comprise:

bit line latches BLT that apply to the different bit lines BL the appropriate voltages BLV when programming memory cells, a word line driver circuit WLDCT that applies to the different word lines WL the voltages SV intended for the selection transistors, a control gate circuit CGCT0 that applies to the different control gate lines CGL the control gate voltages CGV of the floating-gate transistors, a source line switch SLS that applies the source line voltage SLV to the layer NISO, sense amplifiers SA that apply to the different bit lines BL the appropriate voltages BLV when reading memory cells, and supply a binary word read in the memory, for example an 8-bit word B0-B7, a column decoder CDEC, which links the sense amplifiers SA to the different bit lines, and a control circuit BSC for controlling the bias of the wells MPW supplying the control lines SL1, SL2 for controlling the transistors CT1, CT2 with voltages VSL1, VSL2, and the common line CM with a voltage VCM.

Except for the electric potential VB of the wells MPW, the voltages applied to the memory cells C41, C42 are identical to those applied to the memory cells described in Table REF3:

BLV is the voltage applied to the bit line BL and thus applied to the drain regions n1 of the transistors FGT41, FGT42 of each of the pairs PR1, PR2, CGV is the voltage applied to the control gate of a transistor FGT41, FGT42 through a control gate line CGL, SV is the selection voltage applied to the common gate SGC of the transistors ST41, ST42 of a same pair PR1, PR2 through the corresponding word line WL, SLV is the voltage applied to the isolation layer NISO as source line SL.

In this embodiment of the memory cells, the electric potential VB of the wells MPW is not "applied" directly but through the transistors CT1, CT2 of the corresponding bit line BL, during erasing and programming. One embodiment of a method for reading, erasing and programming the memory cells is described below. The voltages supplied by these different units are described in Tables RD6, ER4, PG4 in Appendix 2. In particular, the bit line latches BLT supply the "bias voltage during the programming" or the "non-programming voltage" appearing in Table PG4. The sense amplifiers SA supply the "reading bias voltage" appearing in Table RD6.

Figure 28:
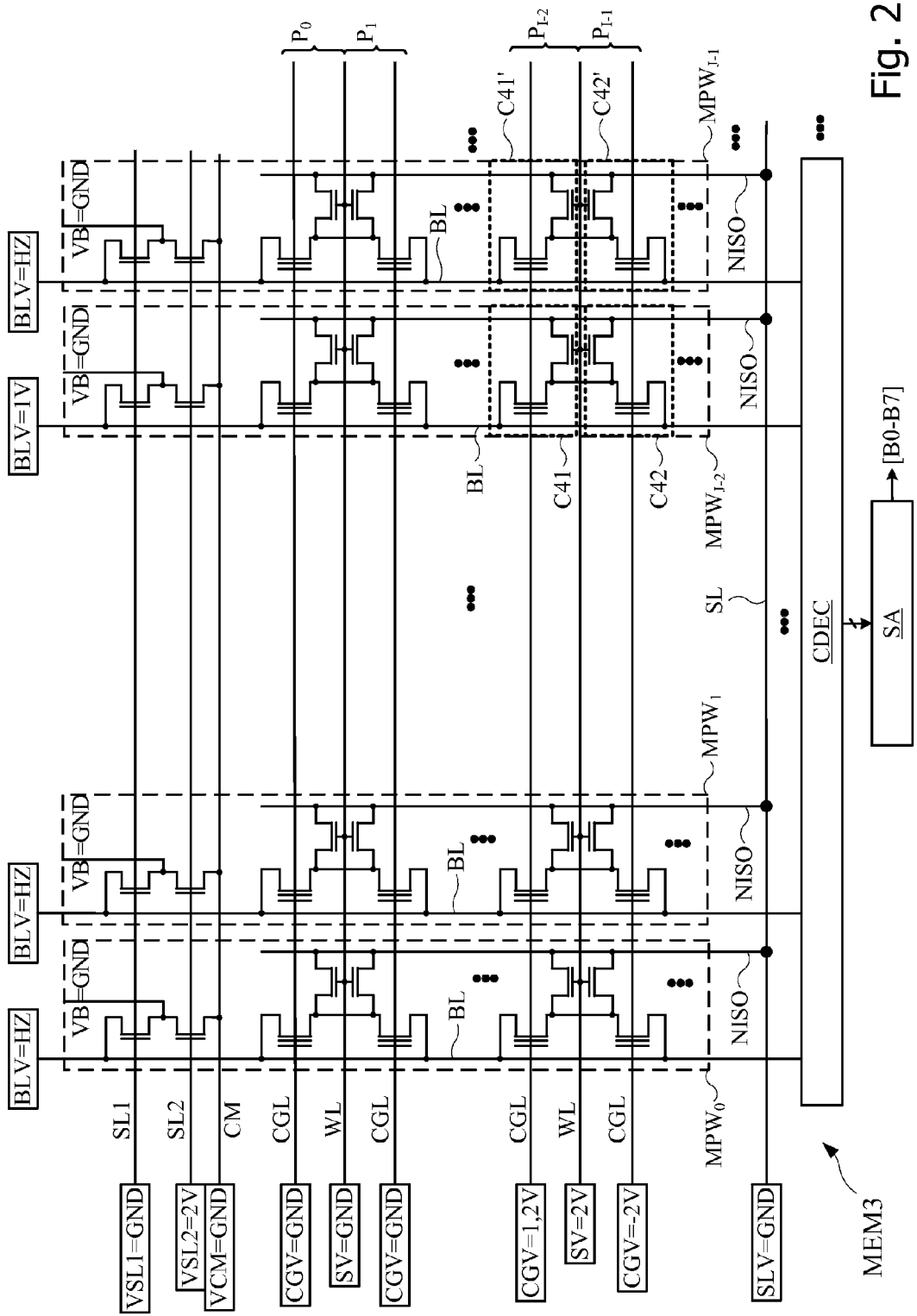

The memory array thus organized enables the previously described methods of reading, erasing and programming to be applied to the memory cells. Table RD6 in Appendix 2 describes in relation with FIG. 28 values of voltages applied to the memory array when reading memory cells. FIG. 28 shows the distribution of these values of voltages when reading a memory cell C41 that is framed in the figure.

When reading the memory cell C41, the mini wells MPW are put to the potential of the common line CM, here to the ground potential GND, by the transistors CT2 on (the transistors CT1 are off). A current passes through the channel region CH1 of the transistor FGT41 of the cell C41, and the vertical channel region CH2 of the corresponding transistors ST41, ST42, under the effect of the voltage SV=Von applied to the common gate SGC, but the associated floating-gate transistor FGT42 (memory cell C42) remains off under the effect of the inhibit voltage Vinh.

Table RD6 also indicates values of voltages applied to the other memory cells, for example C41', when reading a memory cell linked to the same control gate line CGL and to the same word line WL as the memory cell C41, but linked to a bit line other than the bit line BL to which the memory cell C41 is connected (located in another well MPW). The memory cell C41' receives the same voltages as the memory cell C41 during reading, except for the bit line voltage BLV that is taken to a non-read voltage BLV1', here the floating potential HZ. Therefore, no current passes through these memory cells although their transistors FGT41 and ST41/ST42 each have a conductive channel in their channel region CH1, CH2.

Figure 29:
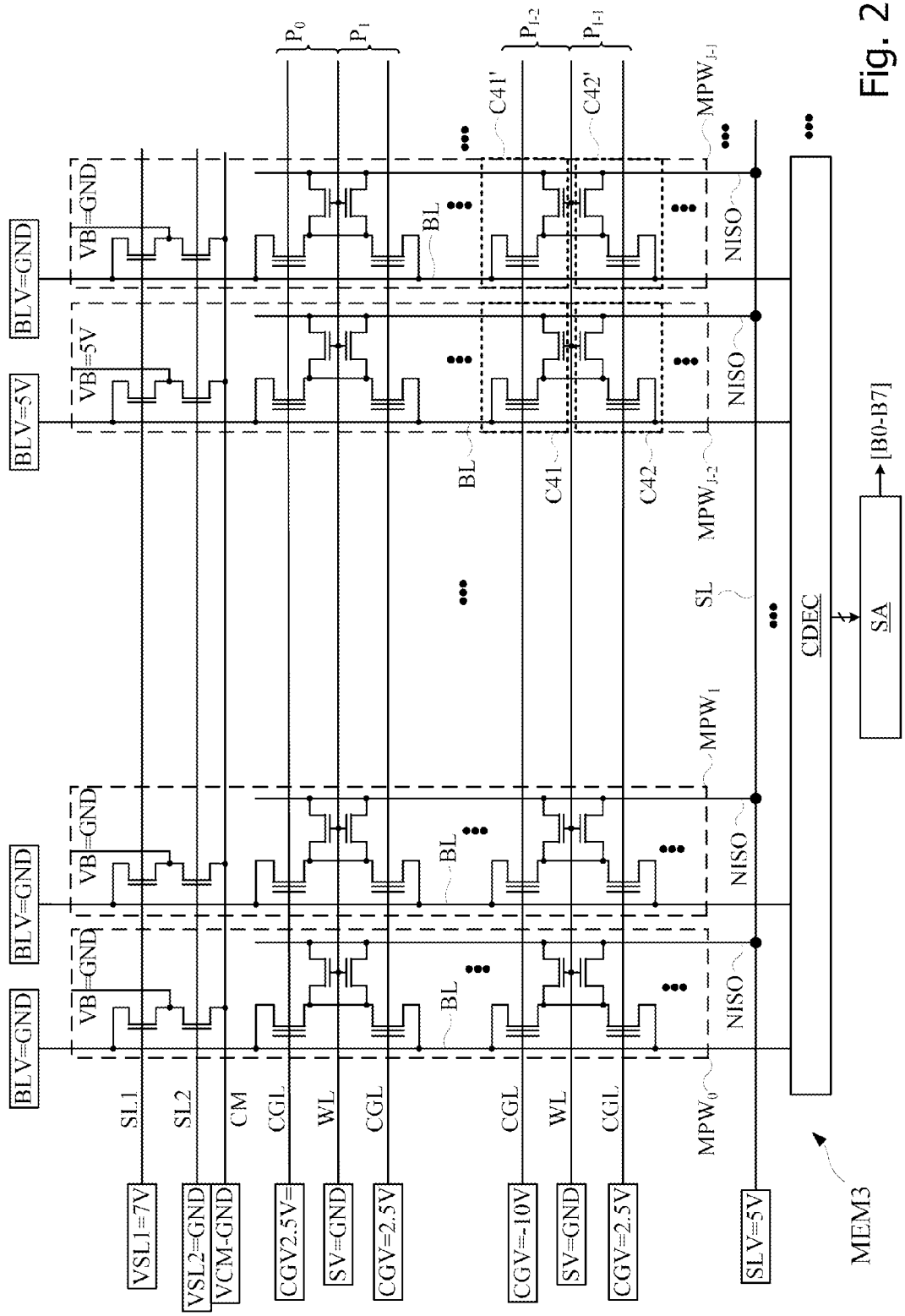

Table ER4 in Appendix 2 describes in relation with FIG. 29 values of voltages applied to the memory array when erasing a word. FIG. 29 shows the distribution of these values of voltages when erasing the memory cell C41 that is framed in the figure. Unlike the erasing method previously described, the bit line BL here receives a positive and non-zero voltage BLV2, for example 5V. The potential VB2, VB2' of the mini wells MPW is put to the same voltage as the corresponding bit lines, through the transistor CT1 in the on state (the transistor CT2 being off). Simultaneously, the control gate CGL of the transistor FGT41 of the memory cell C41 receives the negative erasing voltage Ver, for example −10V. The junction PN between the well MPW and the drain region n1 of the transistor FGT41 is in the off state due to the positive bias applied to the drain region n1 (here 5V) through the bit line BL. In these conditions, an erasing electric field appears between the well and the floating gate FG of the transistor FGT41. This erasing electric field extracts electrons from the floating gate by tunnel effect (Fowler Nordheim effect). Furthermore, the transistor FGT42 of the cell C42 undergoes a soft stress effect due to the difference in potential between the mini well MPW and its control gate, here equal to 2.5V. This soft stress effect is not sufficient to notably extract electric charges from the floating gate of this transistor.

During this erasing process, the potential VB2' of the other wells MPW (which do not contain any erase-selected memory cell) is also put to the voltage of the other bit lines BL, here the ground potential GND.

Table ER4 also indicates values of voltages applied to the memory cells, for example C41' when erasing a memory cell linked to the same control gate line and to the same word line WL as the memory cell C41, but linked to a bit line other than the bit line BL to which the memory cell C41 is linked (in another well). The memory cells C41' receive the same voltages as the memory cell C41 during erasing, except for the bit line voltage BLV that is taken to a non-erasing voltage BLV2', here the ground potential GND. As the transistor FGT41 of the memory cell C41 receives the erasing voltage Ver on its control gate CG, it undergoes a low non-cumulative stress effect, under a difference in potential in the order of 10.6V.

Figure 30:
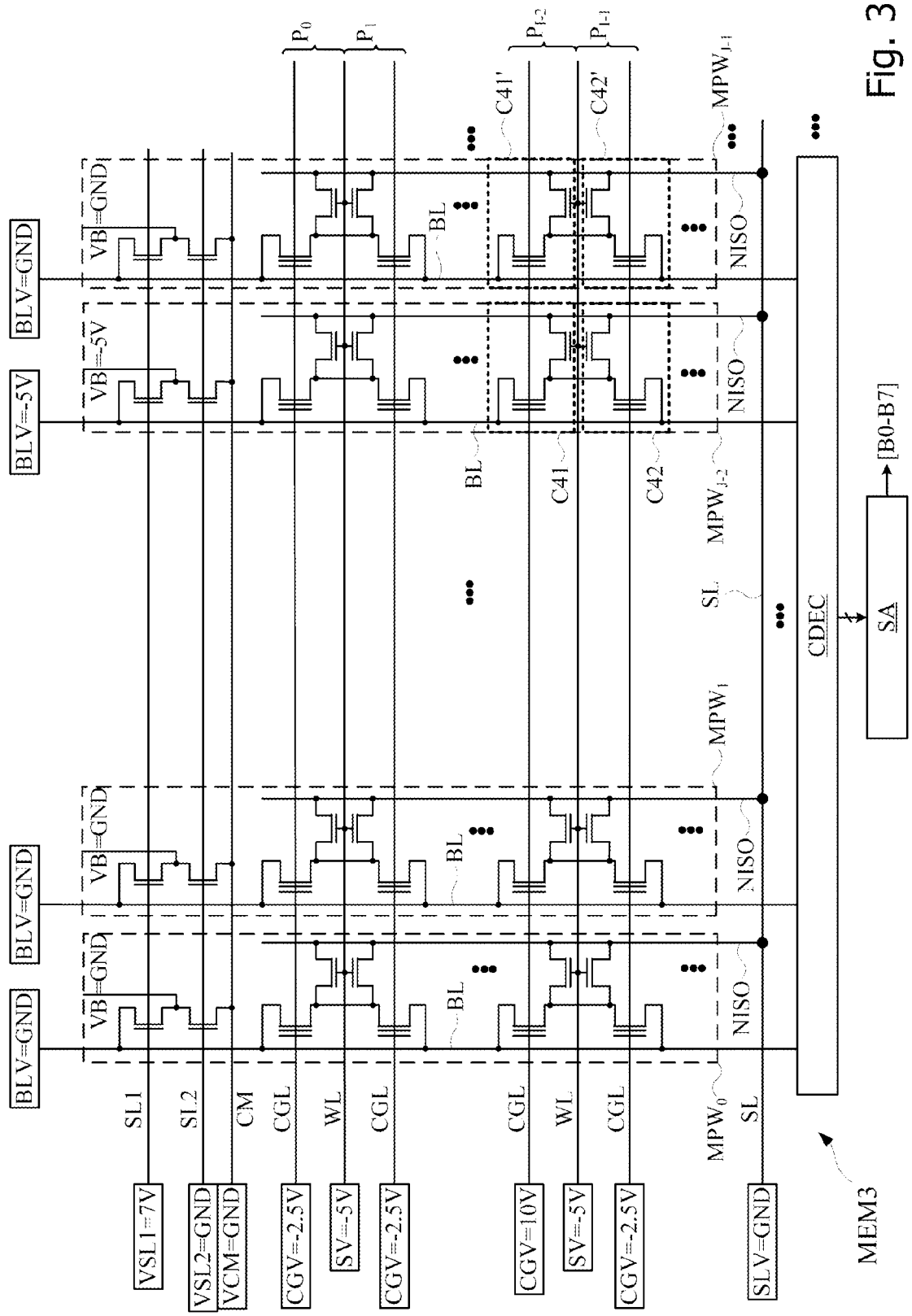
Figure 31:
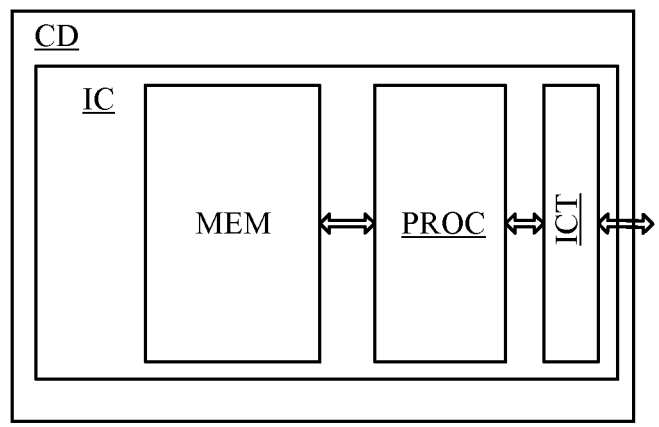
FIG. 31 shows an electronic device comprising a memory according to the present disclosure.

Table PG4 in Appendix 2 describes in relation with FIG. 30 examples of values of voltages applied to the memory array when programming a memory cell. FIG. 30 shows the distribution of these values of voltages when programming the memory cell C41 that is framed in the figure. The voltages applied to the memory cell C41 are identical to those described above in relation with FIG. 12 and Table PG2, except that the wells are put to the potential of the bit line BL through the transistor CT1 in the on state (the transistor CT2 being in the off state). Under the effect of the negative voltage BLV3 applied to the bit line, here −5V, the junctions PN between the drain regions n1 of the transistors FGT41, FGT42 and the mini wells are on. The potentials VB3, VB3' of the wells MPW are respectively equal to −5V and to the ground potential GND. In these conditions, a programming electric field appears between the well MPW and the floating gate FG of the transistor FGT41. This electric field generates a conductive channel in the channel region CH1 of the transistor and causes the injection of electrons into its floating gate by tunnel effect (Fowler Nordheim effect).

Table PG4 in Appendix 2 also indicates values of voltages applied to the memory cells C41' when programming the memory cell C41 linked to the same control gate line CGL and to the same word line WL as the memory cell C41, but linked to a bit line other than the bit line BL to which the memory cell C41 is linked (in another mini well). The other bit line BL is then taken to a non-selection voltage BLV3', here the ground potential GND. In these conditions, the potential VB3' of each other mini well is also taken to the ground potential GND. The transistor FGT41 of the cells C41' undergoes a relatively inactive non-cumulative stress effect due to the 10V potential applied to its control gate CG. As its drain region n1 is linked to the ground through the bit line BL, the conductive channel that is created in its channel region CH1 is kept to 0V and limits the injection of electrons into its floating gate.

In summary, memory cells according to this third embodiment can be read, erased and programmed in a manner similar as those formed according to the second embodiment and represented in FIGS. 6, 7A and 7B, except that they do not require any control of the electric potential of the well PW containing the mini wells MPW, the potential of each mini well being erase- and program-controlled through the bit lines BL, the line CM and the transistors CT1, CT2.

It further appears in Table RD6 that when reading memory cells, a control gate line not selected but linked to the selected control gate line requires a voltage different from that applied to a non-selected control gate line.

Furthermore, as it results from the description above, the segmentation of the well PW into mini wells MPW enables each memory cell to be individually erased or programmed. In practice, the control units of the memory MEM3 can be configured to form a page-erasable, word-erasable or bit-erasable memory according to the application considered. In particular, the bit line latches BLT are configured to control both the erasing and programming of the memory cells, by supplying the different bit line voltages that have just been described.

FIG. 32 represents one example of an application of a memory MEM according to the present disclosure (MEM1, MEM2, MEM3). The memory MEM is arranged in an integrated circuit IC equipped with a processor and an interface communication circuit ICT, for example an integrated circuit for a smart card. The integrated circuit is mounted onto a medium CD, for example a plastic card. With an identical memory capacity, the memory MEM enables the size and the cost price of the integrated circuit to be reduced, or, with an identical integrated circuit surface area, the memory storage capacity to be increased.

It will be understood by those skilled in the art that various alternative embodiments and various other applications of a memory cell according to the present disclosure and a memory according to the present disclosure are possible. In particular, although the description above was of embodiments of memory cells based on floating-gate transistors, other types of charge accumulation transistors may be used, for example transistors equipped with silicon dots buried in a dielectric material, that enable electric charges to be cumulated and replace the floating gates. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

Appendix 1 being an Integral Part of the Description

References Allocated to the Voltages

| REF1 | Voltages applied to the cells C11, C12 |
|---|---|
| BLV | Voltage applied to a bit line BL |
| CGV | Voltage applied to the control gate of a transistor FGT11, FGT12 |
| VB | Voltage applied to the substrate PW (well) |
| SV | Voltage applied to the gate of a transistor ST11, ST12 |
| SLV | Voltage applied to the source line SL |
| VI | Voltage applied to the isolation layer NISO |

| REF2 | Voltages applied to the cells C21, C22 |
|---|---|
| BLV | Voltage applied to a bit line BL |
| CGV | Voltage applied to the control gate of a transistor FGT21, FGT22 |
| VB | Voltage applied to the substrate PW (well) |
| SV | Voltage applied to the gate of a transistor ST21, ST22 |
| SLV | Voltage applied to the isolation layer NISO as source line SL |

| REF3 | Voltages applied to the cells C31, C32 |
|---|---|
| BLV | Voltage applied to a bit line BL |
| CGV | Voltage applied to the control gate of a transistor FGT31, FGT32 |
| VB | Voltage applied to the substrate PW (well) |
| SV | Voltage applied to the common gate SGC of the transistors ST31, ST32 |
| SLV | Voltage applied to the isolation layer NISO as source line SL |

Example of Values of Voltages when Reading a Memory Cell

| RD1 | Ref. | E.g. | Reading of the cell C11 (prior art) |
|---|---|---|---|
| BLV | BLV1 | 1 V | Reading bias voltage |
| CGV | Vrd | 1.2 V | Read voltage of the transistor FGT11 |
| CGV | Vnrd | VB1 | Non-read voltage applied to FGT12 |
| VB | VB1 | GND | Bias voltage during the reading |
| SV | Von | 2 V | Read-select voltage applied to ST11 |
| SV | Voff | GND | Read-cutoff voltage applied to ST12 |
| SLV | SLV1 | GND | Bias voltage during the reading |
| VI | VI1 | GND | Bias voltage during the reading |

| RD2 | Ref. | E.g. | Reading of the cell C11 |
|---|---|---|---|
| BLV | BLV1 | 1 V | Reading bias voltage |
| CGV | Vrd | 1.2 V | Read voltage of the transistor FGT11 |
| CGV | Vinh | −2 V | Inhibit voltage of the transistor FGT12 |
| VB | VB1 | GND | Bias voltage during the reading |
| SV | Von | 2 V | Read-select voltage of the transistors ST11, ST12 |
| SLV | SLV1 | GND | Bias voltage during the reading |
| VI | VI1 | GND | Bias voltage during the reading |

| RD3 | Ref. | E.g. | Reading of the cell C21 |
|---|---|---|---|
| BLV | BLV1 | 1 V | Reading bias voltage |
| CGV | Vrd | 1.2 V | Read voltage of the transistor FGT21 |
| CGV | Vinh | −2 V | Inhibit voltage of the transistor FGT22 |
| VB | VB1 | GND | Bias voltage during the reading |
| SV | Von | 2 V | Read-select voltage of the transistors ST21, ST22 |
| SLV | SLV1 | GND | Bias voltage during the reading |

| RD4 | Ref. | E.g. | Reading of the cell C31, FIG. 9 |
|---|---|---|---|
| BLV | BLV1 | 1 V | Reading bias voltage |
| CGV | Vrd | 1.2 V | Read voltage of the transistor FGT31 |
| CGV | Vinh | −2 V | Inhibit voltage of the transistor FGT32 |
| VB | VB1 | GND | Bias voltage during the reading |
| SV | Von | 2 V | Read-select voltage of the transistors ST31, ST32 |
| SLV | VI1 | GND | Bias voltage during the reading |

Example of Values of Voltages when Erasing a Memory Cell

| ER1 | Ref. | E.g. | Erasing of the cell C11 (prior art) |
|---|---|---|---|
| BLV | BLV2 | HZ | Bias voltage during the erasing |
| CGV | Ver | −10 V | Erasing voltage of the transistor FGT11 |
| CGV | Vner | 2.5 V | Non-erasing voltage of the transistor FGT12 |
| VB | VB2 | 5 V | Bias voltage during the erasing |
| SV | SV2 | 5 V | Bias voltage during the erasing |
| SLV | SLV2 | HZ | Bias voltage during the erasing |
| VI | VI2 | 5 V | Bias voltage during the erasing |

| ER2 | Ref. | E.g. | Erasing of the cell C31, FIG. 11 |
|---|---|---|---|
| BLV | BLV2 | HZ | Bias voltage during the erasing |
| CGV | Ver | −10 V | Erasing voltage of the transistor FGT31 |
| CGV | Vner | 2.5 V | Non-erasing voltage of the transistor FGT32 |
| VB | VB2 | 5 V | Bias voltage during the erasing |
| SV | SV2 | 5 V | Bias voltage during the erasing |
| SLV | VI2 | 5 V | Bias voltage during the erasing |

Example of Values of Voltages when Programming a Memory Cell

| PG1 | Ref. | E.g. | Programming of the cell C11 (prior art) |
|---|---|---|---|
| BLV | BLV3 | −5 V | Bias voltage during the programming |
| CGV | Vpg | 10 V | Programming voltage of the transistor FGT11 |
| CGV | Vnpg | −2.5 V | Non-programming voltage of the transistor FGT12 |
| VB | VB3 | −5 V | Bias voltage during the programming |
| SV | SV3 | −5 V | Bias voltage during the programming |

-continued

| PG1 | Ref. | E.g. | Programming of the cell C11 (prior art) |
|---|---|---|---|
| SLV | SLV3 | HZ | Bias voltage during the programming |
| VI | VI3 | GND | Bias voltage during the programming |

| PG2 | Ref. | E.g. | Programming of the cell C31, FIG. 12 |
|---|---|---|---|
| BLV | BLV3 | −5 V | Bias voltage during the programming |
| CGV | Vpg | 10 V | Programming voltage of the transistor FGT31 |
| CGV | Vnpg | −2.5 V | Non-programming voltage of the transistor FGT32 |
| VB | VB3 | −5 V | Bias voltage during the programming |
| SV | SV3 | −5 V | Bias voltage during the programming |
| SLV | VI3 | GND | Bias voltage during the programming |

| PG2' | Ref. | E.g. | Voltages undergone by a neighboring cell |
|---|---|---|---|
| BLV | BLV3' | GND | Non-programming voltage |
| CGV | Vpg | 10 V | Voltage undergone by the transistor FGT31' |
| CGV | Vnpg | −2.5 V | Voltage undergone by the transistor FGT32' |
| VB | VB3 | −5 V | Bias voltage during the programming |
| SV | SV3 | −5 V | Voltage undergone by the transistors ST31', ST32' |
| SLV | VI3 | GND | Bias voltage during the programming |

Example of Values of Voltages when Reading a Memory Cell (FIG. 21)

| RD5 | | | |
|---|---|---|---|
| Voltage | Line | Value | Status |
| BLV | BL | 1 V | Bit line (BL) selected |
| BLV | BL | HZ | Bit line not selected |
| MCGV | MCGL | 1.2 V | Main control gate line selected |
| MCGV | MCGL | −2 V | Main control gate line not selected linked to the main control gate line selected |
| MCGV | MCGL | GND | Main control gate line not selected |
| CGV | CGL | 1.2 V | Control gate line selected |
| CGV | CGL | −2 V | Control gate line not selected linked to the control gate line selected |
| CGV | CGL | GND | Control gate line not selected |
| VB | — | GND | Well selected |
| VB | — | GND | Well not selected |
| VB | — | −2 V | Well of the switches SS, CS |
| SV | WL | 2 V | Word line selected |
| SV | WL | GND | Word line not selected |
| SLV | NISO | GND | Source line and layer NISO voltage |
| SEL | — | 5 V | Control of the switches SS of the well selected |
| NOSEL | — | −2 V | Control of the switches CS of the well selected |
| SEL | — | 5 V | Control of the switches SS of the well not selected |
| NOSEL | — | −2 V | Control of the switches CS of the well not selected |

Example of Values of Voltages when Erasing a Word (FIG. 22)

| ER3 | | | |
|---|---|---|---|
| Voltage | Line | Value | Status |
| BLV | BL | HZ | Bit line (BL) selected |
| BLV | BL | HZ | Bit line not selected |

-continued

ER3

| Voltage | Line | Value | Status |
|---|---|---|---|
| MCGV | MCGL | −10 V | Main control gate line selected |
| MCGV | MCGL | 2.5 V | Main control gate line not selected linked to the main control gate line selected |
| MCGV | MCGL | 2.5 V | Main control gate line not selected |
| CGV | CGL | −10 V | Control gate line selected |
| CGV | CGL | 2.5 V | Control gate line not selected linked to the control gate line selected |
| CGV | CGL | 2.5 V | Control gate line not selected |
| VB | — | 5 V | Well selected |
| VB | — | GND | Well not selected |
| VB | — | −10 V | Well of the switches SS, CS |
| SV | WL | GND | Word line selected |
| SV | WL | GND | Word line not selected |
| SLV | NISO | 5 V | Source line and layer NISO voltage |
| SEL | — | 5 V | Control of the switches SS of the well selected |
| NOSEL | — | −10 V | Control of the switches CS of the well selected |
| SEL | — | −10 V | Control of the switches SS of the well not selected |
| NOSEL | — | 5 V | Control of the switches CS of the well not selected |

Example of Values of Voltages when Programming a Word (FIG. 23)

PG3

| Voltage | Line | Value | Status |
|---|---|---|---|
| BLV | BL | −5 V | Bit line (BL) selected |
| BLV | BL | GND | Bit line not selected |
| MCGV | MCGL | 10 V | Main control gate line selected |
| MCGV | MCGL | −2.5 V | Main control gate line not selected linked to the main control gate line selected |
| MCGV | MCGL | −2.5 V | Main control gate line not selected |
| CGV | CGL | 10 V | Control gate line selected |
| CGV | CGL | −2.5 V | Control gate line not selected linked to the control gate line selected |
| CGV | CGL | −2.5 V | Control gate line not selected |
| VB | — | −5 V | Well selected |
| VB | — | GND | Well not selected |
| VB | — | −2.5 V | Well of the switches SS, CS |
| SV | WL | −5 V | Word line selected |
| SV | WL | −5 V | Word line not selected |
| SLV | NISO | GND | Source line and layer NISO voltage |
| SEL | — | 13 V | Control of the switches SS of the well selected |
| NOSEL | — | −2.5 V | Control of the switches CS of the well selected |
| SEL | — | −2.5 V | Control of the switches SS of the well not selected |
| NOSEL | — | 5 V | Control of the switches CS of the well not selected |

Appendix 2 being an Integral Part of the Description

Example of Values of Voltages when Reading a Memory Cell (FIG. 28)

RD6

| Voltage | Ref. | Value | Status |
|---|---|---|---|
| BLV | BLV1 | 1 V | Bit line (BL) selected |
| BLV | BLV1' | HZ | Bit line (BL) not selected |
| CGV | Vrd | 1.2 V | Control gate line selected |

RD6

| Voltage | Ref. | Value | Status |
|---|---|---|---|
| CGV | Vinh | −2 V | Control gate line not selected but linked to the control gate line selected |
| CGV | Vnrd | GND | Control gate line not selected and not linked to the control gate line selected |
| VB | VB1 | GND | Bit line well (BL) linked to at least one read-selected memory cell |
| VB | VB1' | GND | Bit line well (BL) not linked to any read-selected memory cell |
| SV | Von | 2 V | Word line (WL) selected |
| SV | Voff | GND | Word line (WL) not selected |
| SLV | VI1 | GND | Source line and layer NISO voltage |
| VCM | | GND | Common line voltage |
| VSL1 | | GND | Selection voltage 1 |
| VSL2 | | 2 V | Selection voltage 2 |

Examples of Values of Voltages when Erasing a Memory Cell (FIG. 29)

ER4

| Voltage | Ref. | Value | Status |
|---|---|---|---|
| BLV | BLV2 | 5 V | Bit line (BL) selected |
| BLV | BLV2' | GND | Bit line (BL) not selected |
| CGV | Ver | −10 V | Control gate line selected |
| CGV | Vner | 2.5 V | Control gate line not selected but linked to the control gate line selected |
| CGV | Vner | 2.5 V | Control gate line not selected and not linked to the control gate line selected |
| VB | VB2 | 5 V | Bit line well (BL) linked to at least one erase-selected memory cell |
| VB | VB2' | GND | Bit line well (BL) not linked to any erase-selected memory cell |
| SV | Voff | GND | Word line (WL) selected |
| SV | Voff | GND | Word line (WL) not selected |
| SLV | VI2 | 5 V | Source line and layer NISO voltage |
| VCM | | GND | Common line voltage |
| VSL1 | | 7 V | Selection voltage 1 |
| VSL2 | | GND | Selection voltage 2 |

Example of Values of Voltages when Programming a Memory Cell (FIG. 30)

PG4

| Voltage | Ref. | Value | Status |
|---|---|---|---|
| BLV | BLV3 | −5 V | Bit line (BL) selected |
| BLV | BLV3' | GND | Bit line (BL) not selected |
| CGV | Vpg | 10 V | Control gate line selected |
| CGV | Vnpg | −2.5 V | Control gate line not selected but linked to the control gate line selected |
| CGV | Vnpg | −2.5 V | Control gate line not selected and not linked to the control gate line selected |
| VB | VB3 | −5 V | Bit line well (BL) linked to at least one program-selected memory cell |
| VB | VB3' | GND | Bit line well (BL) not linked to any program-selected memory cell |
| SV | SV3 | −5 V | Word line (WL) selected |
| SV | SV3 | −5 V | Word line (WL) not selected |
| SLV | VI3 | GND | Source line and layer NISO voltage |
| VCM | | GND | Common line voltage |
| VSL1 | | 7 V | Selection voltage 1 |
| VSL2 | | GND | Selection voltage 2 |

The invention claimed is:
1. A method, comprising:
manufacturing on a semiconductive substrate an integrated circuit with a non-volatile memory including memory cells each including a charge accumulation transistor and a selection transistor, the manufacturing including:

forming in the substrate a deep first doped region, the first doped region forming a source region of common selection transistors of a pair of the memory cells, forming a buried gate in the substrate, the buried gate including deep parts extending between an upper face of the substrate and the first doped region, forming between two adjacent deep parts of the buried gate, a second doped region forming a common drain region of the selection transistors of the pair of the memory cells, such that the selection transistors of the pair of the memory cells have channel regions extending between the first doped region and the second doped region, along opposite faces of the two adjacent deep parts of the buried gate, the faces extending in planes parallel to a channel direction of the charge accumulation transistors, and forming along opposite upper edges of the buried gate, third doped regions forming source regions of the charge accumulation transistors of the pair of memory cells, each third doped region being electrically coupled to the second doped region.

2. A method according to claim 1, wherein forming the first doped region comprises forming in the substrate a deep isolation layer surrounding a well in which the memory cells are formed.

3. A method according to claim 1, wherein forming the buried gate comprises forming conductive trenches in the substrate, forming the conductive trenches including:

forming in the substrate trenches having respective deep parts reaching the first doped region, forming the second doped region at a bottom of the trench, depositing an insulating layer on inner edges of the trench, and filling the trenches with a conductive material, the filling forming the deep parts of the buried gate in the trenches and forming superficial gate portions linking the deep parts of the buried gate to each other, the conductive trenches forming gates of selection transistors of the memory cells, common to two rows of the memory cells.

4. A method according to claim 1, comprising forming an isolation trench, wherein forming the buried gate includes sectioning the isolation trench into individual sections after forming the isolation trench.

5. A method according to claim 4, wherein the first doped region is part of a deep doped isolation layer and the isolation trench reaches the deep doped isolation layer, at a depth greater than a depth of the deep parts of the buried gate.

6. A method according to claim 1, comprising forming on the upper face of the substrate conductive lines parallel to the conductive trench, the conductive lines forming control gates for controlling the charge accumulation transistors.

7. An integrated circuit comprising:

a non-volatile memory formed in a semiconductive substrate, the memory including pair of memory cells each including a charge accumulation transistor in series with a selection transistor, the memory including:

a deep first doped region forming a common source region of the selection transistors of the pair of memory cells;

a buried gate common to the selection transistors of the pair of memory cells, the buried gate including adjacent deep parts extending between an upper face of the substrate and the first doped region;

a second doped region extending between the adjacent deep parts of the buried gate, and forming a common drain region of the selection transistors of the pair of memory cells, the selection transistors of the pair of memory cells having respective channel regions extending between the first doped region and the second doped region, along opposite faces of the adjacent deep parts of the buried gate, the faces extending in planes parallel to a channel direction of the charge accumulation transistors; and third doped regions extending along upper edges of the buried gate, forming drain regions of the charge accumulation transistors of the pair of memory cells, each third doped region being electrically linked to the second doped region.

8. An integrated circuit according to claim 7, wherein the first doped region forms an isolation layer delimiting a well in which the memory cells are formed, the isolation layer forming a source line of the selection transistors of the pair of memory cells.

9. An integrated circuit according to claim 7, wherein the buried gate comprises a superficial part linking the deep parts, and thus forms a conductive trench.

10. An integrated circuit according to claim 7, wherein the memory comprises two isolation trench sections separated from each other by the conductive trench.

11. An integrated circuit according to claim 10, including a deep doped isolation layer, wherein the isolation trench sections are part of an isolation trench that reaches the deep doped isolation layer, and forms mini wells isolated from each other, the pair of memory cells being one of plural pairs of memory cells formed in one of the mini wells.

12. An integrated circuit according to claim 7, wherein the memory includes two rows of memory cells each including groups of memory cells which can be individually erased, the memory cells of one of the rows being formed in different isolated wells.

13. An integrated circuit according to claim 7, wherein the memory comprises first and second isolated wells in which first and second lines of memory cells are respectively formed, each line being configured to be biased by a common voltage.

14. A device, comprising:

a processor; and a non-volatile memory formed in a semiconductive substrate, the memory including pair of memory cells each including a charge accumulation transistor in series with a selection transistor, the memory including:

a deep first doped region forming a common source region of the selection transistors of the pair of memory cells;

a buried gate common to the selection transistors of the pair of memory cells, the buried gate including adjacent deep parts extending between an upper face of the substrate and the first doped region;

a second doped region extending between the adjacent deep parts of the buried gate, and forming a common drain region of the selection transistors of the pair of memory cells, the selection transistors of the pair of memory cells having respective channel regions extending between the first doped region and the second doped region, along opposite faces of the adjacent deep parts of the buried gate, the faces extending in planes parallel to a channel direction of the charge accumulation transistors; and third doped regions extending along upper edges of the buried gate, forming drain regions of the charge accumulation transistors of the pair of memory cells, each third doped region being electrically linked to the second doped region.

15. A device according to claim 14, wherein the first doped region forms an isolation layer delimiting a well in which the memory cells are formed, the isolation layer forming a source line of the selection transistors of the pair of memory cells.

16. A device according to claim 14, wherein the buried gate comprises a superficial part linking the deep parts, and thus forms a conductive trench.

17. A device according to claim 16, wherein the memory comprises two isolation trench sections separated from each other by the conductive trench.

18. A device according to claim 17, wherein the memory includes a deep doped isolation layer, wherein the isolation trench sections are part of an isolation trench that reaches the deep doped isolation layer, and forms mini wells isolated from each other, the pair of memory cells being one of plural pairs of memory cells formed in one of the mini wells.

19. A device according to claim 14, wherein the memory includes two rows of memory cells each including groups of memory cells which can be individually erased, the memory cells of one of the rows being formed in different isolated wells.

20. A device according to claim 14, wherein the memory comprises first and second isolated wells in which first and second lines of memory cells are respectively formed, each line being configured to be biased by a common voltage.

21. A device according to claim 14, wherein:
- the adjacent deep parts of the buried gate extend to and contact the first doped region;
- the buried gate comprises a conductive trench formed in the semiconductor substrate and linking the deep parts to each other; and
- the second doped region extends below the conductive trench of the buried gate.

22. An integrated circuit according to claim 7, wherein:
- the adjacent deep parts of the buried gate extend to and contact the first doped region;
- the buried gate comprises a conductive trench formed in the semiconductor substrate and linking the deep parts to each other; and
- the second doped region extends below the conductive trench of the buried gate.

* * * * *